(12) United States Patent
Ikeda

(10) Patent No.: US 9,356,063 B2
(45) Date of Patent: May 31, 2016

(54) IMAGE SENSOR, PRODUCTION APPARATUS, PRODUCTION METHOD, AND ELECTRONIC DEVICE

(71) Applicant: Sony Corporation, Tokyo (JP)

(72) Inventor: Harumi Ikeda, Kanagawa (JP)

(73) Assignee: Sony Corporation, Toyko (JP)

( * ) Notice: Subject to any disclaimer, the term of this patent is extended or adjusted under 35 U.S.C. 154(b) by 4 days.

(21) Appl. No.: 14/323,518

(22) Filed: Jul. 3, 2014

(65) Prior Publication Data

US 2015/0015758 A1    Jan. 15, 2015

(30) Foreign Application Priority Data

Jul. 10, 2013 (JP) .................................. 2013-144502

(51) Int. Cl.
*H01L 27/146* (2006.01)

(52) U.S. Cl.
CPC ...... *H01L 27/14627* (2013.01); *H01L 27/1464* (2013.01); *H01L 27/14621* (2013.01); *H01L 27/14623* (2013.01); *H01L 27/14625* (2013.01); *H01L 27/14685* (2013.01)

(58) Field of Classification Search
CPC .................. H01L 27/14621; H01L 27/14627; H01L 27/14623; H01L 27/14625
USPC .......................................................... 257/294
See application file for complete search history.

(56) References Cited

U.S. PATENT DOCUMENTS 7,511,750 B2 *   3/2009   Murakami ................... 348/294

FOREIGN PATENT DOCUMENTS

JP         2005-72097 A       3/2005

* cited by examiner

*Primary Examiner* — Howard Weiss
*Assistant Examiner* — Tifney Skyles
(74) *Attorney, Agent, or Firm* — Sheridan Ross P.C.

(57) ABSTRACT

Provided is an image sensor including a photoelectric conversion unit for converting a received light into an electric charge; a semiconductor substrate including the photoelectric conversion unit; and a plurality of areas each having a refractive index different from a refractive index of the semiconductor substrate formed between a surface of the semiconductor substrate on which light is incident and the photoelectric conversion unit. Also, provided are an apparatus and a method of producing the image sensor, and an electronic device including the image sensor.

13 Claims, 20 Drawing Sheets

IMAGE SENSOR, PRODUCTION APPARATUS, PRODUCTION METHOD, AND ELECTRONIC DEVICE

CROSS REFERENCE TO RELATED APPLICATIONS

This application claims the benefit of Japanese Priority Patent Application JP 2013-144502 filed Jul. 10, 2013, the entire contents of which are incorporated herein by reference.

BACKGROUND

The present technology relates to an image sensor, a production apparatus, a production method and an electronic device. More particularly, the present technology relates to an image sensor, a production apparatus, a production method and an electronic device being capable of improving a sensitivity and preventing ghosts caused by a reflected light.

SUMMARY

A solid state imaging apparatus includes a semiconductor substrate, and a plurality of photoelectric conversion units such as photo diodes as respective light receiving cells formed on a surface of the semiconductor substrate in a two dimensional arrangement (a matrix array), for example. When light is incident on each photoelectric conversion unit, a signal charge is generated in response to the light. The signal charge is read out as a video signal by a transmission electrode.

In the solid state imaging apparatus having the above-described configuration, the light incident on the photoelectric conversion unit from outside is greatly lost due to reflection of light at a boundary between the surface of the photoelectric conversion unit and an oxide film formed on the surface of the photoelectric conversion unit. The amount of light received at the photoelectric conversion unit is undesirably decreased, and a sufficient sensitivity may not be provided on the photoelectric conversion unit.

Japanese Patent Application Laid-open No. 2005-72097 proposes that a sensitivity of a photoelectric conversion unit is improved by forming a concaveconvex portion in a thickness direction of a substrate between a substrate of the photoelectric conversion unit and an insulation film.

As described above, when the light is reflected in the solid state imaging apparatus, the sensitivity may become poor. Also, ghosts may be generated by the reflected light. As described in Japanese Patent Application Laid-open No. 2005-72097, the Moth Eye structure (a surface concaveconvex structure) has been proposed. However, the concaveconvex structure may generate unevenness or peeling when a protection film and a color filter is formed subsequently, which may result in a decreased performance and a low yield of the image sensor.

It is therefore desirable to improve a sensitivity of an image sensor and to prevent ghosts caused by a reflected light.

According to an embodiment of the present technology, there is provided an image sensor, including:

a photoelectric conversion unit for converting a received light into an electric charge;

a semiconductor substrate including the photoelectric conversion unit; and a plurality of areas each having a refractive index different from that of the semiconductor substrate formed between a surface of the semiconductor substrate on which light is incident and the photoelectric conversion unit.

Each of the areas may be formed to have a wide area at a depth near a light incident surface of the silicon substrate, and have a narrow area at a depth farther from the light incident surface.

Each of the areas may have a conical shape.

A relationship n1<n3<n2 may be satisfied where a film on the semiconductor substrate has a refractive index n1, the semiconductor substrate has a refractive index n2, and each of the areas has a refractive index n3.

The semiconductor substrate may be formed of silicon.

The areas may comprise either one of amorphous silicon, SiC, $Si_3N_3$ and $SiO_2$.

On the semiconductor substrate, an oxide film or a nitride film may be formed.

Each of the areas may have a diameter of 100 nm to 300 nm and have a deepest position of 400 nm or less having a hole concentration of $1E16/cm^3$ or more.

The areas may be formed in different sizes depending on a wavelength of light received at the photoelectric conversion unit.

The areas may be formed by ion implantation using a tapered resist mask or a hard mask, and by laser annealing.

According to an embodiment of the present technology, there is provided an apparatus of producing an image sensor including a photoelectric conversion unit for converting a received light into an electric charge and a semiconductor substrate including the photoelectric conversion unit, including:

a unit for forming a plurality of areas each having a refractive index different from that of the semiconductor substrate formed between a surface of the semiconductor substrate on which light is incident and the photoelectric conversion unit.

The areas may be formed by ion implantation using a tapered resist mask or a hard mask, and by laser annealing.

According to an embodiment of the present technology, there is provided a method of producing an image sensor including a photoelectric conversion unit for converting a received light into an electric charge and a semiconductor substrate including the photoelectric conversion unit, including:

forming a plurality of areas each having a refractive index different from that of the semiconductor substrate between a surface of the semiconductor substrate on which light is incident and the photoelectric conversion unit.

According to an embodiment of the present technology, there is provided an electronic device, including:

a photoelectric conversion unit for converting a received light into an electric charge;

a semiconductor substrate including the photoelectric conversion unit, and including a plurality of areas each having a refractive index different from that of the semiconductor substrate formed between a surface of the semiconductor substrate on which light is incident and the photoelectric conversion unit;

an optical component for leading an incident light to the photoelectric conversion unit; and a signal processing unit for processing an output signal from the photoelectric conversion unit.

By the apparatus and the method according to an embodiment of the present technology, the image sensor is produced.

The electronic device according to an embodiment of the present technology includes the image sensor.

According to embodiments of the present technology, a sensitivity of an image sensor can be improved and ghosts caused by a reflected light can be prevented.

These and other objects, features and advantages of the present technology will become more apparent in light of the

DETAILED DESCRIPTION OF EMBODIMENTS

Hereinafter, an embodiment of the present technology will be described with reference to the drawings.

The embodiments of the present technology will be described in the following order.
1. Configuration of Imaging Apparatus
2. Configuration of Image Sensor
3. Areas having a different refractive index
4. Production
5. First Step of producing Area
6. Second Step of producing Area
<Configuration of Imaging Device>

The present technology described hereinbelow is applicable to general electronic devices where an image capturing unit (photoelectric conversion unit) uses a semiconductor package including an imaging apparatus such as a digital still camera and a video camera, a mobile terminal apparatus having an imaging function such as a mobile phone, and a copy machine using an imaging apparatus in an image reading unit.

Figure 1:
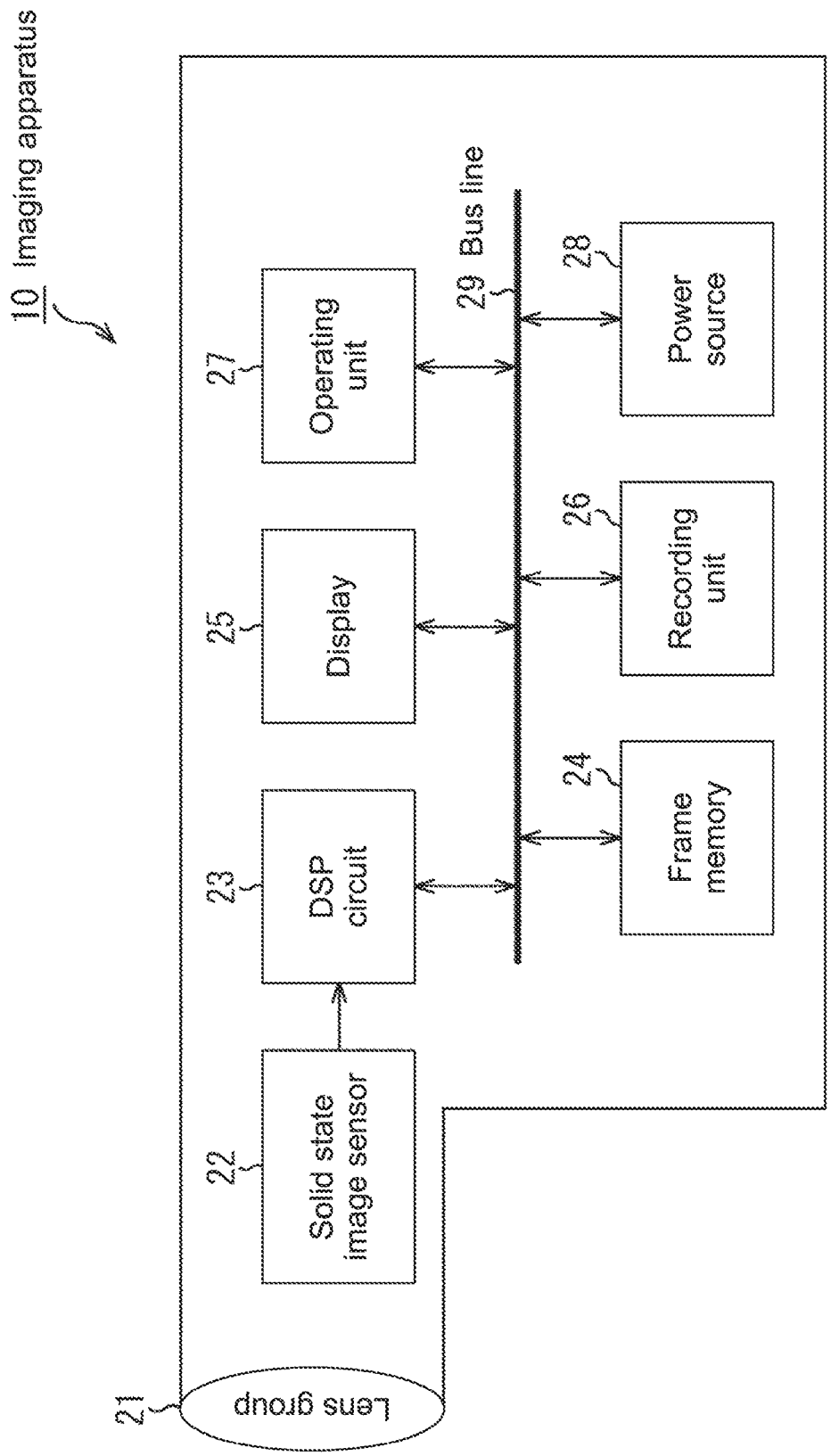
FIG. 1 is a view for showing a configuration of an imaging apparatus.

FIG. 1 is a block diagram showing a configuration embodiment of an imaging apparatus as an electronic device according to an embodiment of the present technology. An imaging apparatus 10 shown in FIG. 1 includes an optical component including a lens group 21, a solid state image sensor (imaging device) 22, a DSP (Digital Signal Processor) circuit 23, a frame memory 24, a display 25, a recording unit 26, an operating unit 27 and a power source 28. The DSP circuit 23, the frame memory 24, the display 25, the recording unit 26, the operating unit 27 and the power source 28 are mutually connected via a bus line 29.

The lens group 21 receives an incident light (an imaging light) from an object to be imaged and forms an image on an imaging area of the solid state image sensor 22. The solid state image sensor 22 converts an incident light amount when the image is formed on the imaging area by the lens group 21 into an electrical signal per pixel unit, and outputs it as a pixel signal.

The DSP circuit 23 processes a signal from the solid state image sensor 22. For example, although details are described below, the solid state image sensor 22 has pixels for detecting a focal point, and processes the signal from the pixels to detect the focal point. Also, the solid state image sensor 22 has pixels for constructing images of an object captured, and processes the signal from the pixels to expand the signal to the frame memory 24.

The display 25 is composed of a panel display such as a liquid crystal display apparatus and an organic EL (Electro Luminescence) display panel, and displays a moving image or a still image. The recoding unit 26 records the moving image or the still image captured by the solid state image sensor 22 on a recording medium such as a video tape and a DVD (Digital Versatile Disk).

The operating unit 27 issues an operating command about a variety of functions belonging to the imaging apparatus by a user's operation. The power source 28 supplies a variety of power sources for operation to a target to be supplied such as the DSP circuit 23, the frame memory 24, the display 25, the recording unit 26 and the operating unit 27, as appropriate.
<Configuration of Image Sensor>

Figure 2:
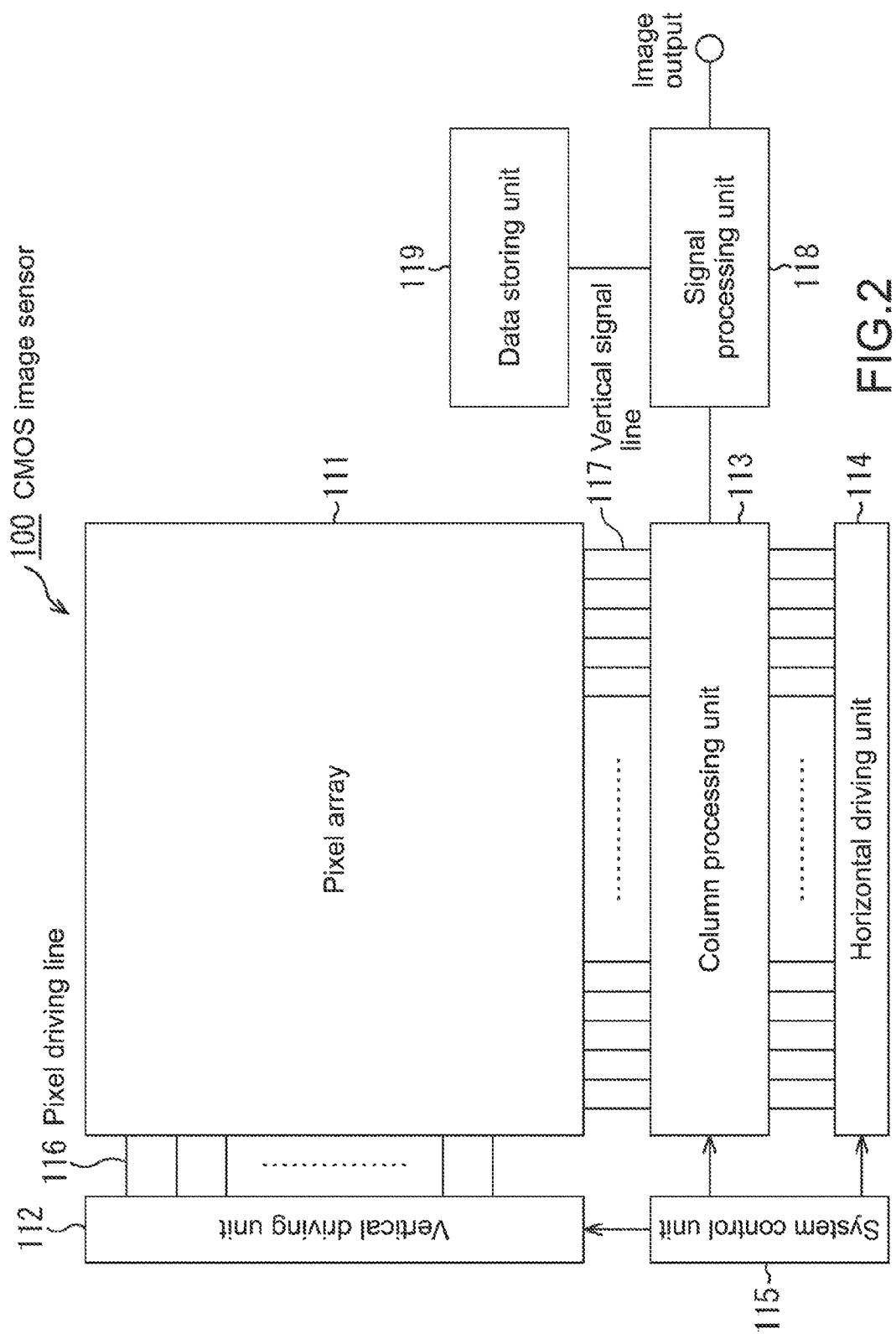
FIG. 2 is a view for showing a configuration of a solid state image sensor.

FIG. 2 is a view for showing a configuration of a solid state image sensor 22, and is a schematic system configuration of a CMOS image sensor that is one of X-Y address system imaging apparatuses, for example. Herein, the CMOS image sensor refers to an image sensor produced by applying a CMOS process or partly utilizing the CMOS process.

A CMOS image sensor 100 shown in FIG. 2 has a configuration including a pixel array 111 formed on a semiconductor substrate (not shown), and peripheral circuits integrated on the semiconductor substrate on which the pixel array 111 is formed. The peripheral circuits are configured of a vertical driving unit 112, a column processing unit 113, a horizontal driving unit 114 and a system control unit 115.

The CMOS image sensor 100 further includes a signal processing unit 118 and a data storing unit 119. The signal processing unit 118 and the data storing unit 119 may be disposed on the substrate of the CMOS image sensor 100, or may be disposed on other substrate from the CMOS image sensor 100. Processing by the signal processing unit 118 and the data storing unit 119 may be carried out by an external signal processing unit, e.g., a DSP (Digital Signal Processor) circuit or a software disposed on other substrate from the CMOS image sensor 100.

The pixel array 111 includes unit pixels (hereinafter may be simply referred to as "pixels") each having a photoelectric conversion unit for generating and accumulating photocharges based on a received light amount are disposed in row and column directions, i.e., in a two-dimensional matrix array. The row direction refers to a pixel row direction (i.e., a horizontal direction), and the column direction refers to a pixel column direction (i.e., a vertical direction).

In the pixel array 111 in a row and column arrangement, pixel driving lines 116 are wired per pixel row along the row direction, and vertical signal lines 117 are wired per pixel column along the column direction. The pixel driving lines 116 transmit a driving signal for driving to read out a signal from a pixel. In FIG. 2, although each pixel driving line 116 is shown as a single wire, it is not limited to one. One end of each pixel driving line 116 is connected to an output terminal corresponding to each row of the vertical driving unit 112.

The vertical driving unit 112 is composed of a shift resistor, an address decoder and the like, and drives each of pixel in the pixel array 111 concurrently or per row. In other words, the vertical driving unit 112 and the system control unit 115 for controlling the vertical driving unit 112 configure a driving unit for each pixel in the pixel array 111. The vertical driving unit 112 is not shown in detail, but generally includes two scanning systems: a read out scanning system and a sweep out scanning system.

The read out scanning system selectively scans a unit pixel of the pixel array 111 per row in order to read out a signal from the unit pixel. The signal read out from the unit pixel is an analogue signal. The sweep out scanning system sweeps a reading out row scanned by the read out scanning system before the read out scanning system scans for a shutter speed time.

Unnecessary charges are swept out from the photoelectric conversion unit of the unit pixel in the read out row by the sweep out scanning system, thereby resetting the photoelectric conversion unit. By sweeping out (resetting) the unnecessary charges by the sweep out scanning system, a so-called electronic shutter operation is carried out. Herein, the electronic shutter operation refers to an operation for throwing out the photocharges and for starting new exposure (for starting accumulation of the photocharges).

The signal read out by the read out scanning system corresponds to a light mount received directly before the read out operation or after the electronic shutter operation. A time duration from a read out timing directly before the read out operation or a sweep out timing by the electronic shutter operation to a read out timing by the read out operation at this time will be an exposure time of the photocharges in the unit pixel.

Each signal outputted from each unit pixel in the pixel row selectively scanned by the vertical driving unit 112 is inputted to the column processing unit 13 through each vertical signal line 117 per pixel row. The column processing unit 113 carries out a predetermined signal processing to a signal outputted through the vertical signal line 117 from each pixel per row selected, and temporarily holds the pixel signal after signal processing.

Specifically, the column processing unit 113 carries out a signal processing such as a noise removal processing, for example, a CDS (Correlated Double Sampling) processing. The CDS processing by the column processing unit 113 removes a fixed pattern noise inherent to the pixel such as a reset noise and a threshold deviation of an amplifying transistor within the pixels. The column processing unit 113 may have an AD (Analog to Digital) conversion function in addition to the noise removal processing to convert and output the analog pixel signal to the digital signal.

The horizontal driving unit 114 is composed of a shift resistor, an address decoder and the like, and sequentially selects a unit circuit corresponding to the pixel row of the column processing unit 113. Through selectively scanning by the horizontal driving unit 114, the pixel signal processed in the column processing unit 113 is sequentially outputted per unit circuit.

The system control unit 115 is composed of a timing generator for generating a variety of timing signals, and drives and controls the vertical driving unit 112, the column processing unit 113 and the horizontal driving unit 114 based on a variety of timings generated by the timing generator.

The signal processing unit 118 at least has an arithmetic processing function, and carries out a variety of signal processing such as arithmetic processing to the pixel signal outputted from the column processing unit 113. The data storing unit 119 temporarily stores necessary data for the signal processing in the signal processing unit 118.

Figure 3:
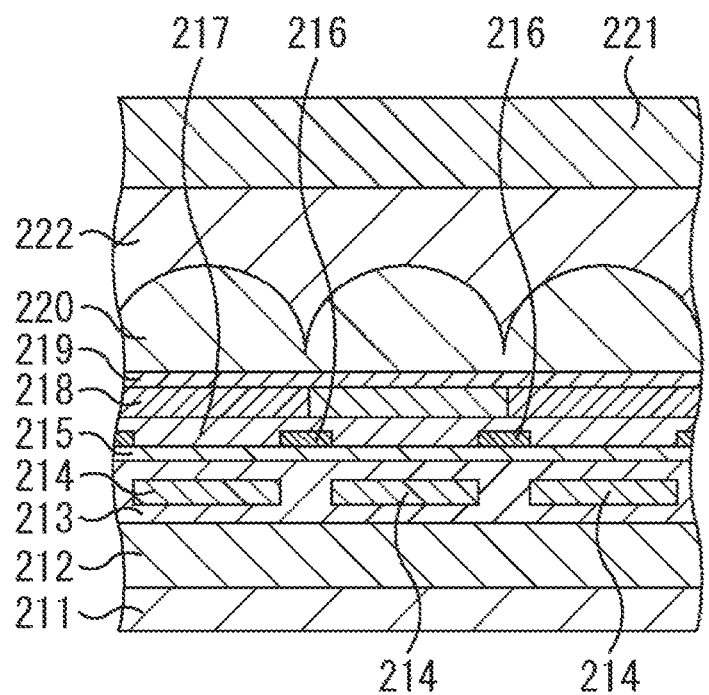
FIG. 3 is a view for showing a configuration of a semiconductor package.

FIG. 3 is a schematic cross sectional view for showing a basic structure of a semiconductor package for configuring the CMOS image sensor 100 shown in FIG. 2 that is the imaging apparatus to which the present technology is applied. A semiconductor package 200 shown in FIG. 3 configures a back illumination type CMOS image sensor.

As described later, areas having a different refractive index exist within a silicon surface where photo diodes 214 are disposed. However, such areas are not shown in the semiconductor package 200 in FIG. 3. The configuration shown in FIG. 3 described later is an example. The present technology described later can be applied to other configurations where a layer or layers may be added to each layer described later or any of the layers described later may be removed. Also, a silicon substrate 213 may be other semiconductor substrate having the photoelectric conversion function.

In the semiconductor package 200 within an effective pixel area shown in FIG. 3, a wiring layer 212 composed of an insulation layer and a metal is disposed on a support substrate 211, and the silicon substrate 213 is disposed on the wiring layer 212. The support substrate 211 may be formed of silicon, glass epoxy, glass, plastic or the like. In the silicon substrate 213, a plurality of photo diodes 214 (optical elements) are formed as the photoelectric conversion unit of each pixel at predetermined spaces.

On the silicon substrate 213 and the photodiodes 214, a protection film 215 composed of an insulation substance is formed. On the protection film 215, light shielding films 216 for preventing light leakage into adjacent pixels are formed between adjacent photo diodes 214.

On the protection film 215 and the light shielding films 216, a planarization film 217 is formed for planarizing an area on which color filters are formed. On the planarization film 217, color filter layers 218 are formed. In the color filter layer 218, a plurality of color filters are disposed per pixel, and are arranged by the Bayer array, for example.

On the color filter layer 218, a first organic material layer 219 is formed. The first organic material layer 219 is formed of an acrylic based resin material, a styrenic based resin material, an epoxy based resin material or the like. On the first organic material layer 219, microlenses 220 are formed. Thus, the microlenses 220 for collecting light to each photo diode 214 are formed per pixel. The microlenses 220 are inorganic material layers and are formed of SiN, SiO, SiOxNy (where 0<x<=1, 0<y<=1).

Above the microlenses 220, a cover glass 221 is bonded via a second organic material layer 222. The cover glass 221 is not limited to glass, but may be a transparent plate made of a resin. Between the microlenses 222 and the cover glass 221, a protection film for preventing moisture or impurities from entering may be formed. The second organic material layer 222 is formed of the acrylic based resin material, the styrenic based resin material, the epoxy based resin material or the like similar to the first organic material layer 219.

<Areas Having Different Refractive Index>

Figure 4:
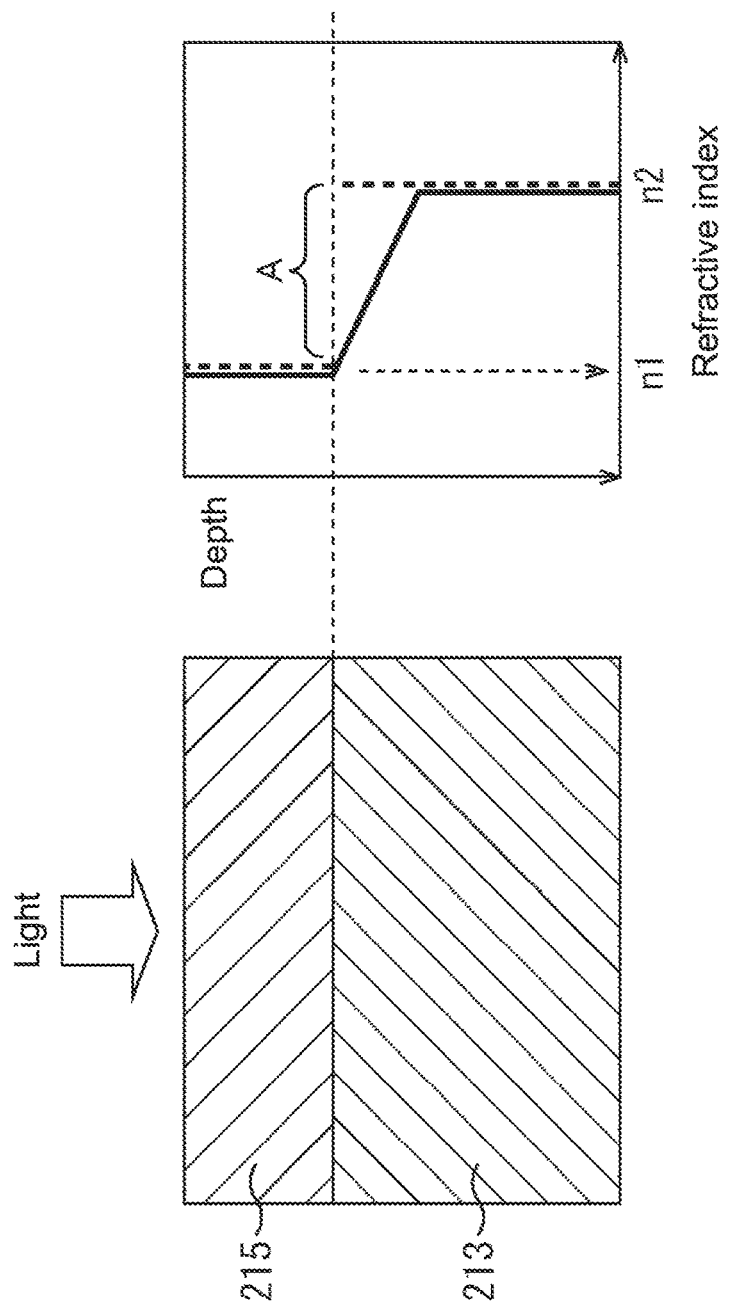
FIG. 4 is a view for illustrating a reflection depending on a difference in refractive indices.

The areas having a different refractive index exist in the silicon substrate 213 including the photo diodes 214 with which the protection film 215 is contacted. A left view of FIG. 4 shows the silicon substrate 213 including the photo diodes 214, and the protection film 215 formed on the silicon substrate 213. The silicon substrate 213 has a refractive index n2, and the protection film 215 has a refractive index n1. For example, when the protection film 215 is an oxide film, the refractive index n1 is 1.6 to 2.1. For example, the silicon substrate 213 has the refractive index n2 of 3.4 to 4.2.

Light is incident from the protection film 215 having he refractive index n1 to the silicon substrate 213 having the refractive index n2. When light proceeds from one material to the other material having different refractive indices like the refractive index n1 and the refractive index n2, a part of the light is reflected. In this case, a light amount of the light incident on the silicon substrate 213 (the photo diodes 214 disposed in the silicon substrate 213) may be decreased to decrease a sensitivity of the photo diodes 214.

In the right view of FIG. 4, a horizontal axis represents a refractive index and a vertical axis represents a depth. In the right view of FIG. 4, a solid line represents an ideal change in the refractive indices. The protection film 215 has the refractive index n1, and the silicon substrate 213 has the refractive index n2. Ideally, the refractive index is gradually changed from the refractive index n1 to the refractive index n2. The change is shown by the solid line. However, as shown in a dotted line in the right view of FIG. 4, the refractive index is changed steeply from the refractive index n1 to the refractive index n2 at a boundary between the silicon substrate 213 and the protection film 215.

When a difference A between the refractive indices is great at the boundary between the silicon substrate 213 and the protection film 215, it affects a reflection at the boundary between the silicon substrate 213 and the protection film 215. In other words, it is desirable that the difference between, in this case, the refractive index n1 and the refractive index n2 be small.

Figure 5:
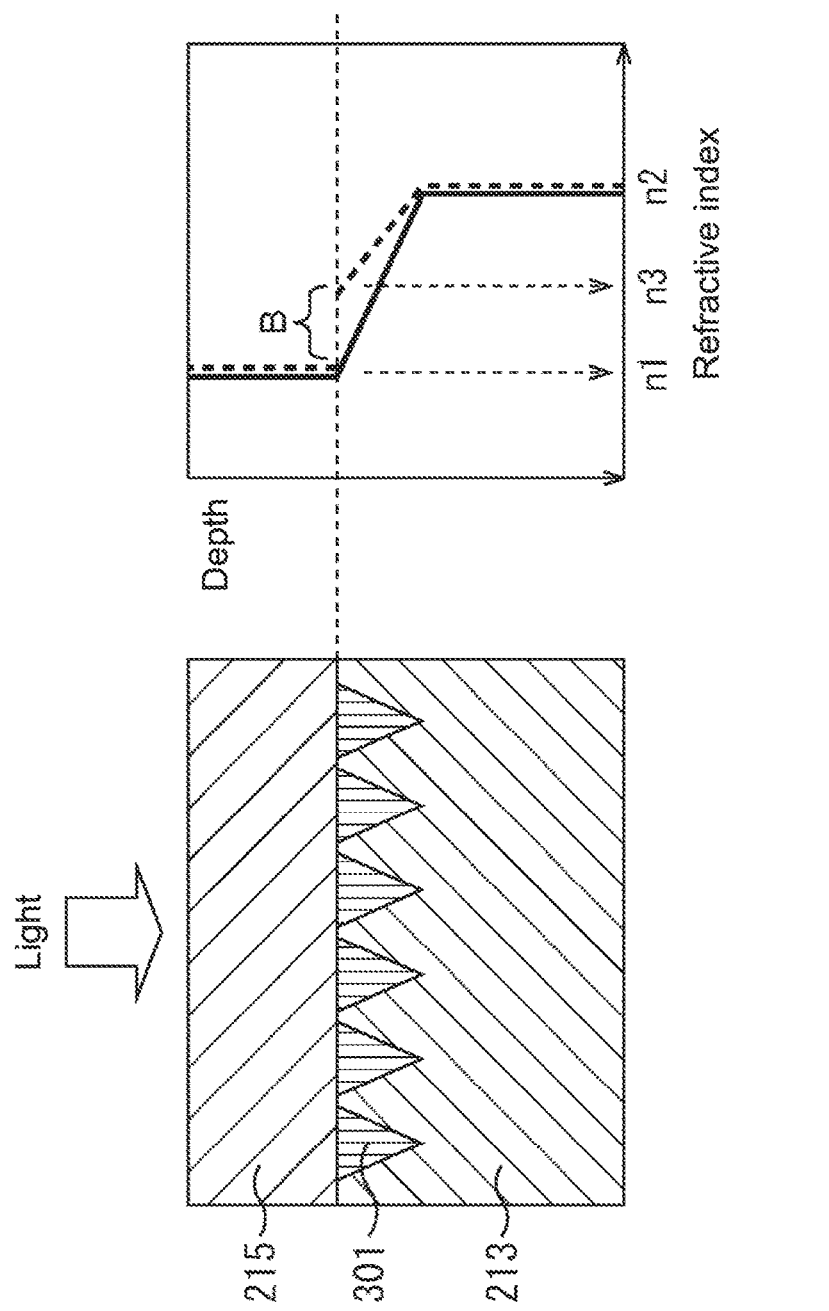
FIG. 5 is a view for illustrate a reflection depending on a difference in refractive indices.

In order to close to the ideal change where the refractive index n1 is gradually changed to the refractive index n2, areas 301 shown in a left view of FIG. 5 are disposed in the silicon substrate 213. A number of the areas 301 are disposed between the photo diodes 214 (not shown in the left view of FIG. 5) as the photoelectric conversion unit and a surface of the silicon substrate 213 on which light is incident (a surface on which the protection film 215 is disposed).

The areas 301 has a refractive index n3, where a relationship n1<n3<n2 is satisfied. When the protection film 215 is an oxide film, the relationship n1 (1.6 to 2.1)<n3<n2 (3.4 to 4.2) is satisfied.

In a right view of FIG. 5 similar to the right view of FIG. 4, a horizontal axis represents a refractive index and a vertical axis represents a depth. In the right view of FIG. 5, a solid line represents an ideal change in the refractive indices. As to the configuration shown in the left view of FIG. 5, as shown in the right view of FIG. 5 by a dotted line, the protection film 215 has the refractive index n1, and the refractive index of the silicon substrate 213 is gradually changed from the refractive index n3 to the refractive index n2. Ideally, the refractive indices are gradually changed from the refractive index n1 to the refractive index n2. The change is shown by the solid line. By disposing the areas 301 having the refractive index n3, it turns out that it becomes closer to the change represented by the solid line.

At the boundary between the silicon substrate 213 and the protection film 215, the refractive index is changed from the refractive index n1 to the refractive index n3. Within the silicon substrate 213, the refractive index is changed from the refractive index n3 to the refractive index n2. A difference B between the refractive indices at the boundary between the silicon substrate 213 and the protection film 215 is a difference between the refractive index n1 and the refractive index n3.

As the relationship between the n1<n3<n2 is satisfied, the difference B between the refractive index n1 and the refractive index n3 is smaller than the difference A between the refractive index n1 and the refractive index n2. As the difference between the refractive indices at the boundary between the silicon substrate 213 and the protection film 215 affects the reflection at the boundary between the silicon substrate 213 and the protection film 215, the difference is desirably small. By disposing the areas 301 in the silicon substrate 213, the difference becomes small, whereby the effect on the reflection at the boundary between the silicon substrate 213 and the protection film 215 can be decreased.

It is desirable that the refractive index n3 of the areas 301 be the refractive index n1. When n3=n1, the refractive index is gradually changed from the refractive index n1 (the refractive index n3) to the refractive index n2 in the silicon substrate 213, as shown in the right view of FIG. 5 by the solid line. It is therefore possible to most effectively inhibit the reflection at the boundary between the silicon substrate 213 and the protection film 215.

As shown in the left view of FIG. 5, the areas 301 are disposed in the silicon substrate 213 and are not disposed in the silicon substrate 213. In other words, the protection film 215 is disposed such that the silicon substrate 213 has no concaveconvex portion. Accordingly, when the protection film 215 and the color filter layer 218 are formed on the silicon substrate 213, unevenness or peeling can be prevented, which may be generated if the silicon substrate 213 has the concaveconvex portion. In this manner, it is possible to prevent a decrease in the yield.

As shown in the left view of FIG. 5, each area 301 has a triangular shape in cross section. Each bottom is at a protection film 215 side, and each top is at a wiring layer 212 (not shown) side. Although not shown, each area 301 is disposed in a conical shape. The shape of each area 301 is not limited to the conical shape, but may be other shapes. For example, each area 301 may have a rotating shape having a predetermined shape such as a trapezoid shape.

In other words, each area 301 has a wide area at a depth near a light incident surface of the silicon substrate 213 (at a surface where the protection film 215 is disposed), and has a narrow area at a depth farther from the light incident surface (approaching to the photo diodes 214).

Although the left view of FIG. 5 shows the areas 301 disposed regularly, the areas 301 may not be disposed regularly. In other words, the areas 301 may be randomly. In addition, although the left view of FIG. 5 shows the areas 301 having the same height, the areas 301 may have different heights. The areas 301 have not only the different heights, but also different bases (bottom surfaces).

Specifically, the shape, the size, the position etc. of each area 301 are not limited to those shown in the left view of FIG. 5, and are changeable.

As the areas 301 are disposed between the boundary of the silicon substrate 213 and the photo diodes 214, the areas 301 are desirably formed in a size (height) to fit inside. For example, when a distance between the boundary of the silicon substrate 213 and the photo diodes 214 is 500 nm, a deepest position (height) of the areas 301 will be 400 nm or less.

It is also possible that the shape and the size of each area 301 may be configured such that the shape and the size are optimized by a wavelength of light incident on the silicon substrate 213. For example, the areas 301 may be configured such that the shape and the size are optimized depending on a wavelength of light transmitted through the color filter layer 218. When the color filter layer 218 is composed of RGB (Red, Green, Blue), each area 301 can be optimized depending on the wavelength of the light transmitted through each color filter layer 218 of R, G and B.

The shape, the size and the position will be further described in a production method as described later. The areas 301 are formed using a tapered resist and ion implantation, metal and a resist mask, laser or the like. Specifically, the areas 301 can be formed by ion implantation using a tapered resist mask or a hard mask, and by laser annealing, for example.

When the areas 301 are disposed in the silicon substrate 213, the protection film 215 formed on the silicon substrate 213 is an oxide film, and the oxide film has a refractive index of 1.6 to 2.1, the minute areas 301 having the different refractive index formed in the silicon substrate 213 are formed of α-Si, SiO$_2$, SiN or SiC.

The protection film 215 may be formed of a nitride film. Alternatively, other than the protection film 215, an antireflection film for inhibiting reflection may be disposed. By the refractive indices of the films disposed on the silicon substrate 213, the configuration of the areas 301 may be suitably changed as appropriate.

As described later, the areas 301 can comprise amorphous silicon or Si$_3$N$_3$ other than the above-described of α-Si, SiO$_2$, SiN or SiC.

Next, a method of producing an image sensor having the areas 301 will be described, referring to flow charts shown in FIGS. 6 to 9.

Figure 10A:
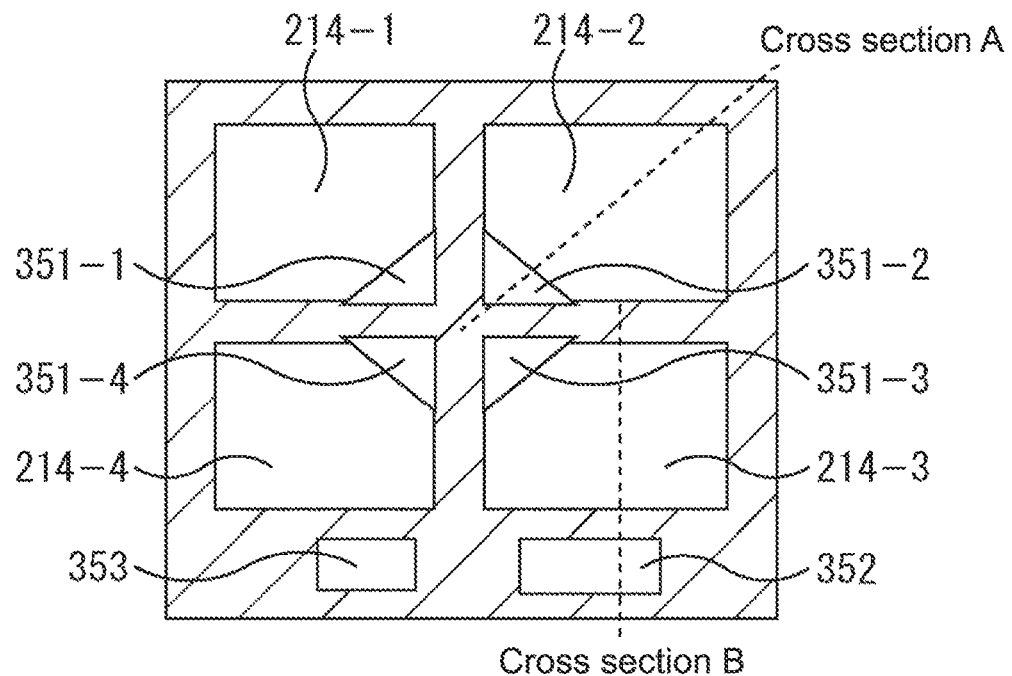
FIGS. 10A and 10B each is a view for illustrating a part of a pixel to be produced.
Figure 10B:
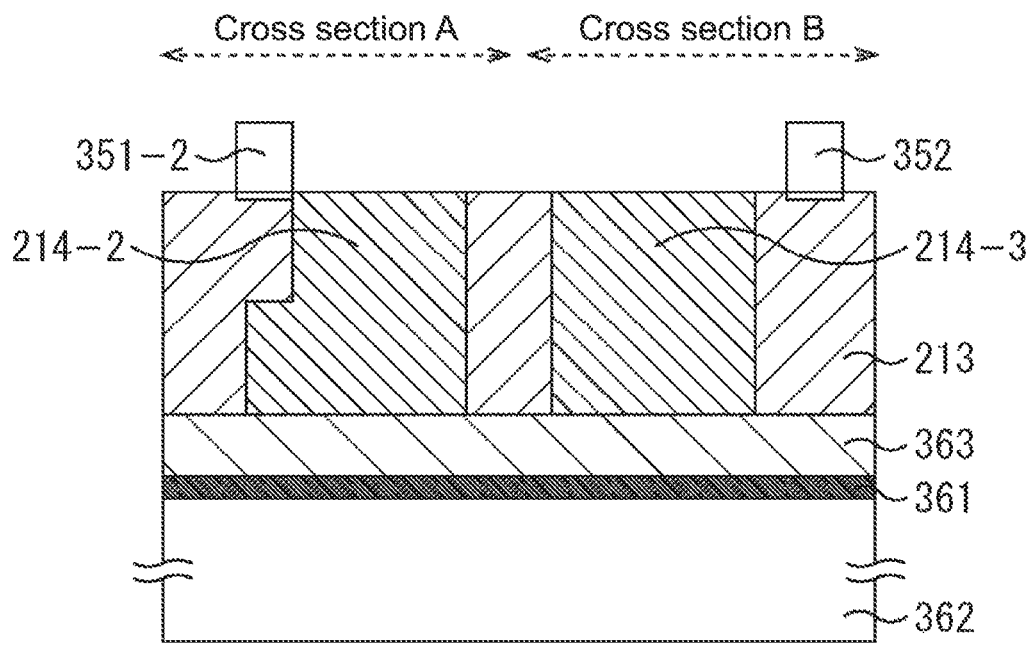

Firstly, a part of the pixels produced by processes of steps S11 to S16 in FIG. 6 will be described. FIGS. 10A and 10B each is a view for illustrating a part of the image sensor to be produced viewed from a light incident side. Herein, the method of producing a back illumination type image sensor having four common pixels and the areas 301 will be described. The production method described below can be applied to image sensors having other configurations. Changing the order of the processes tailored based on the image sensor produced is also involved in the present technology.

The four common pixels shares at least one of an amplifier transistor, a selection transistor, a reset transistor and floating diffusion in adjacent four pixels, and a photo diode and a transfer transistor are mounted on each pixel.

The pixel shown in FIG. 10A has a configuration that four pixels (photo diodes 214-1 to 214-4) arranged in two-by-two share transistors. At a center of the four pixels, a floating diffusion (FIG. 11) area is formed. By surrounding the floating diffusion, transfer transistors 351-1 to 351-4 for the adjacent four pixel are disposed.

The pixel shown in FIG. 10A includes the amplifier transistor 352 and the reset transistor 353 shared by the photo diodes 214-1 to 214-4. Pixel separation areas are disposed around the photo diodes 214. The four pixels of the photo diodes 214-1 to 214-4 share the amplifier transistor 352, the floating diffusion 371 (FIG. 11) and the reset transistor 353.

FIG. 10B shows a cross sectional view of the pixel shown in FIG. 10A along cross sections A and B. Around the photo diodes 214, a P type well layer is disposed as the pixel separation areas. Under the photo diodes 214, the oxide film 361 and the silicon substrate 362 are disposed.

Figure 6:
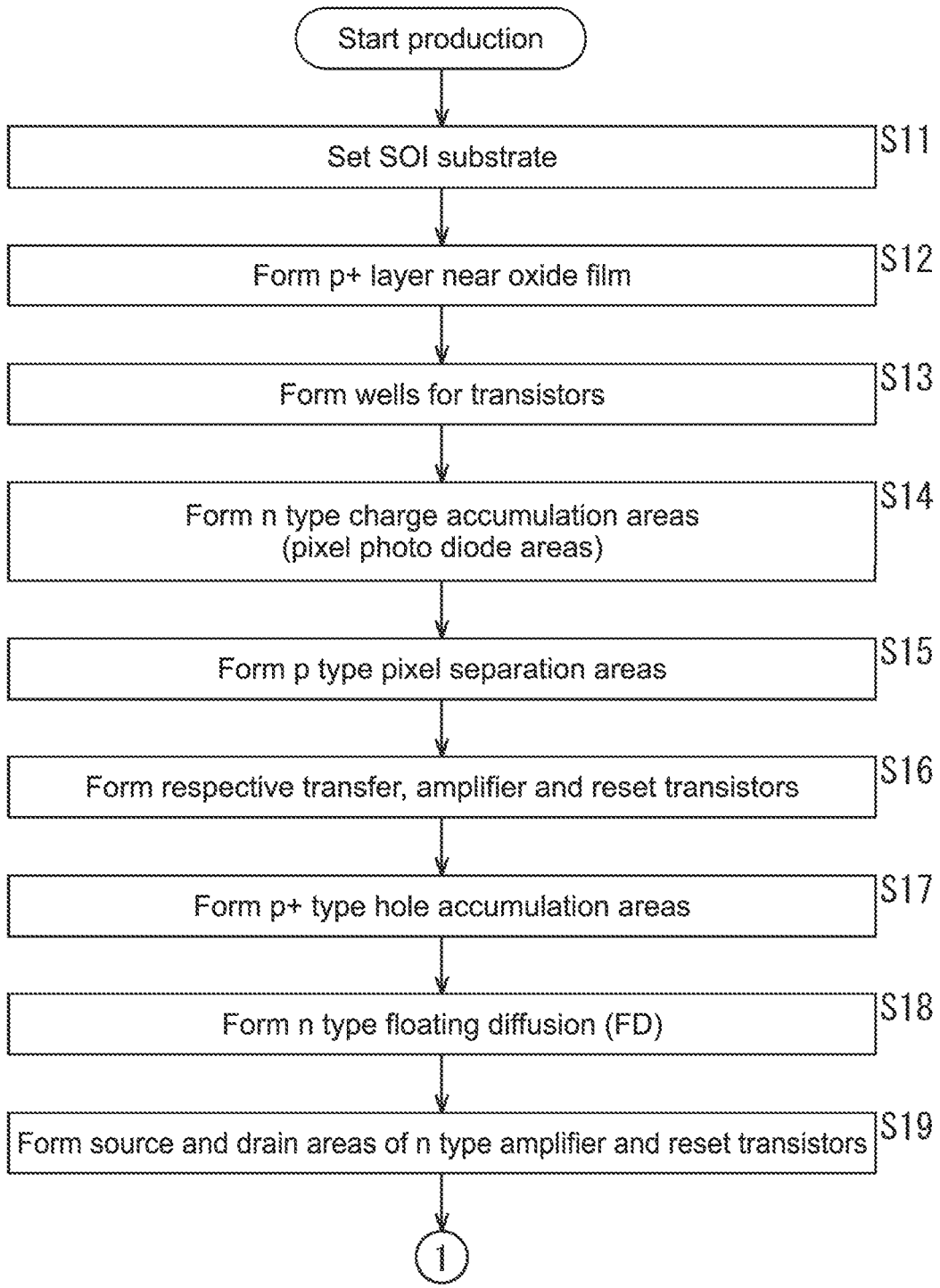
FIG. 6 is a flow chart for illustrating a production of a semiconductor package.

The pixel is produced by setting a SOI substrate in the step S11 (FIG. 6). Herein, the SOI substrate and an n type charge accumulation layer are used. The present technology can also be applied to the case that a bulk substrate and a p type charge accumulation layer are used.

In the step S12, a bottom p+ layer 363 is formed as the p type areas on the silicon substrate 213 near the oxide film 316. In the step S13, wells for the transistors are formed near the surface of the silicon substrate 213 (the opposite surface of the surface where the oxide film 361 is disposed).

The bottom p+ layer 363 forming the p type areas and P-well layers are formed by boron ion implantation and annealing at 1000° C. Specifically, the bottom p+ layer 363 is formed by injecting a 5E12/cm$^2$ dose of boron at 2.5 MeV to a concentration of about 1E16 to 1E18/cm$^3$.

In the step S14, n type charge accumulation areas are formed, which correspond to the photo diodes 214 in FIGS. 10A and 10B. In the step S15, p type pixel separation areas are formed.

The n type charge accumulation areas are formed by phosphorus ion implantation, for example. The p type pixel separation areas (separation P-wells) are formed by boron ion implantation and annealing at 1000° C., for example.

In the step S16, respective gate portions of the transfer transistor 351, the amplifier transistor 352 and the reset transistor 353 are formed. The gate portions of the transistors are formed by CVD polysilicon film formation and lithography patterning, for example.

Figure 11A:
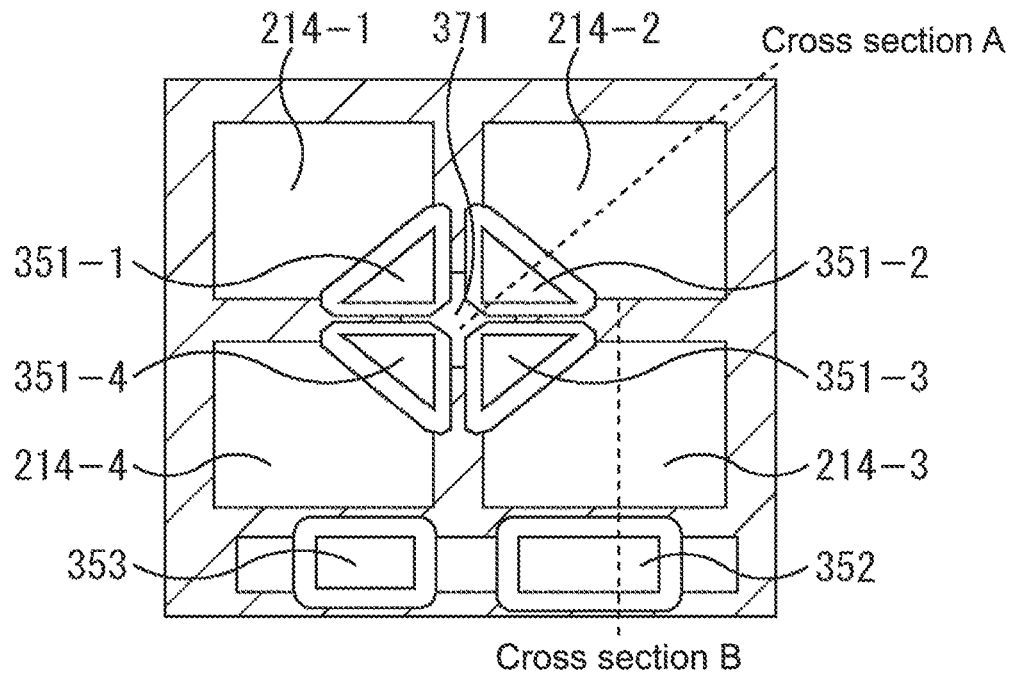
FIGS. 11A and 11B each is a view for illustrating a part of a pixel to be produced.
Figure 11B:
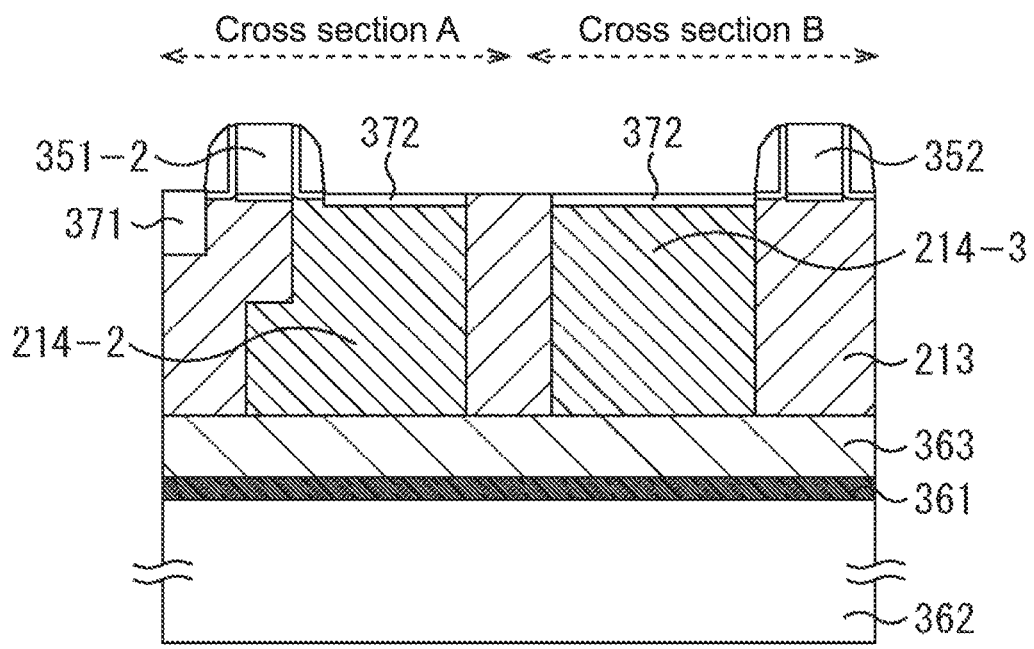

By the steps, a part of the pixel shown in FIGS. 10A and 10B is formed. Next, through the steps S17 to S19, a part of the pixel shown in FIGS. 11A and 11B is formed.

In the step S17, p type hole accumulation areas are formed. Hole accumulation areas 372 are formed at the positions of the photo diodes 214 of the silicon substrate 213, as shown in FIG. 11B. The p type hole accumulation areas are formed by boron ion implantation, for example.

In the step S18, n type floating diffusion (FD) 371 is formed. In the step S19, respective source and drain areas (ND) of the amplifier transistor 352 and the reset transistor 353 are formed.

The source and drain areas (ND) of the floating diffusion 371, the amplifier transistor 352 and the reset transistor 353 can be formed by arsenic ion implantation and short annealing at 1100° C., for example.

Figure 12:
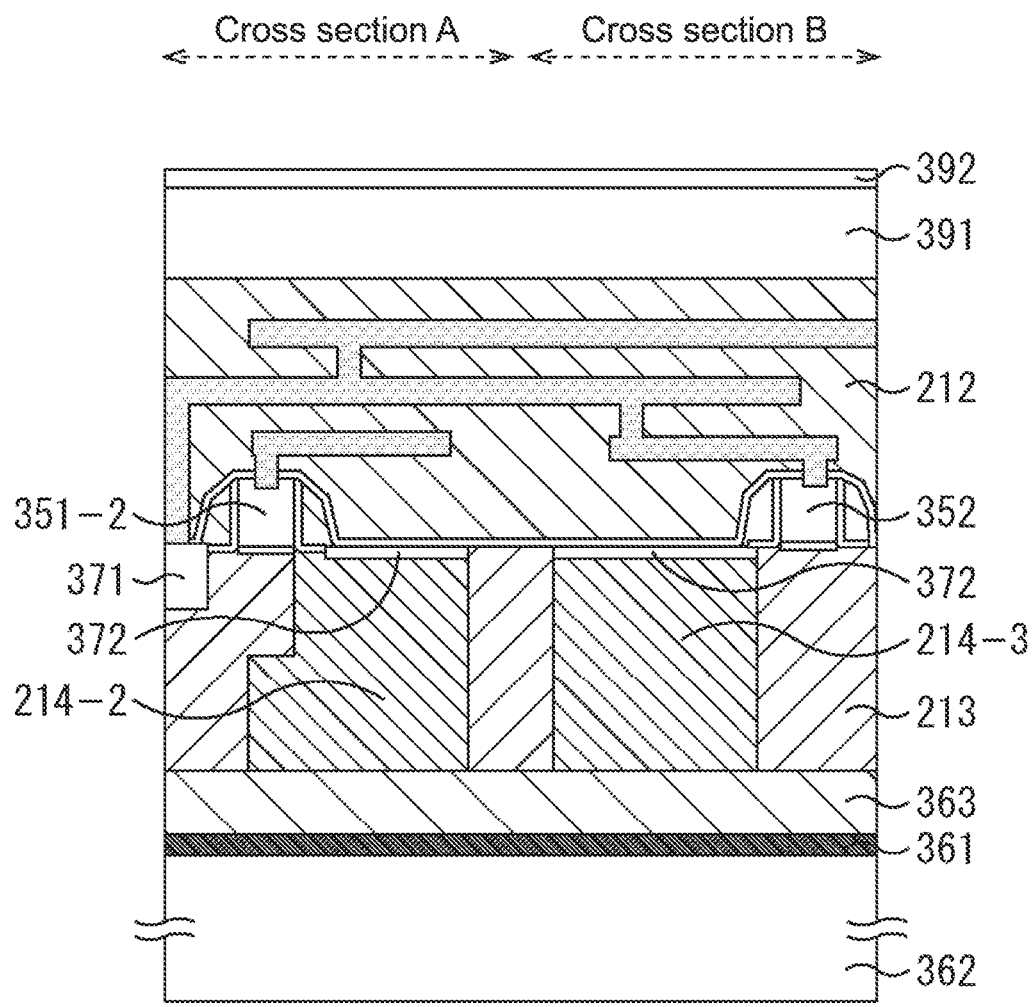
FIG. 12 is a view for illustrating a part of a pixel to be produced.

By the processing, a part of the pixel shown in FIGS. 11A and 11B is formed. Next, through the steps S20 to S23 (FIG. 7), a part of the pixel shown in FIG. 12 is formed. In the step S20, a silicide block film is formed. In the step S21, an interlayer insulation film is formed to form a contact plug. Furthermore, in the step S22, a wiring layer is formed.

By carrying out the processing, as shown in FIG. 12, the wiring layer 212 is formed on the transfer transistor 351, the amplifier transistor 352, the reset transistor 353 and the floating diffusion 371. By forming the wiring layer 212, the transfer transistor 351, the amplifier transistor 352, the reset transistor 353 and the floating diffusion 371 are controlled, thereby outputting a signal per pixel provided.

In the step S23, a planarization layer 391 and an adhesion layer 392 are formed. The planarization layer 391 is formed on the wiring layer 212, and the adhesion layer 392 is formed on the planarization layer 391. The planarization layer 391 and the adhesion layer 392 are formed for adhering to the support substrate to provide a back illumination type structure.

Figure 13:
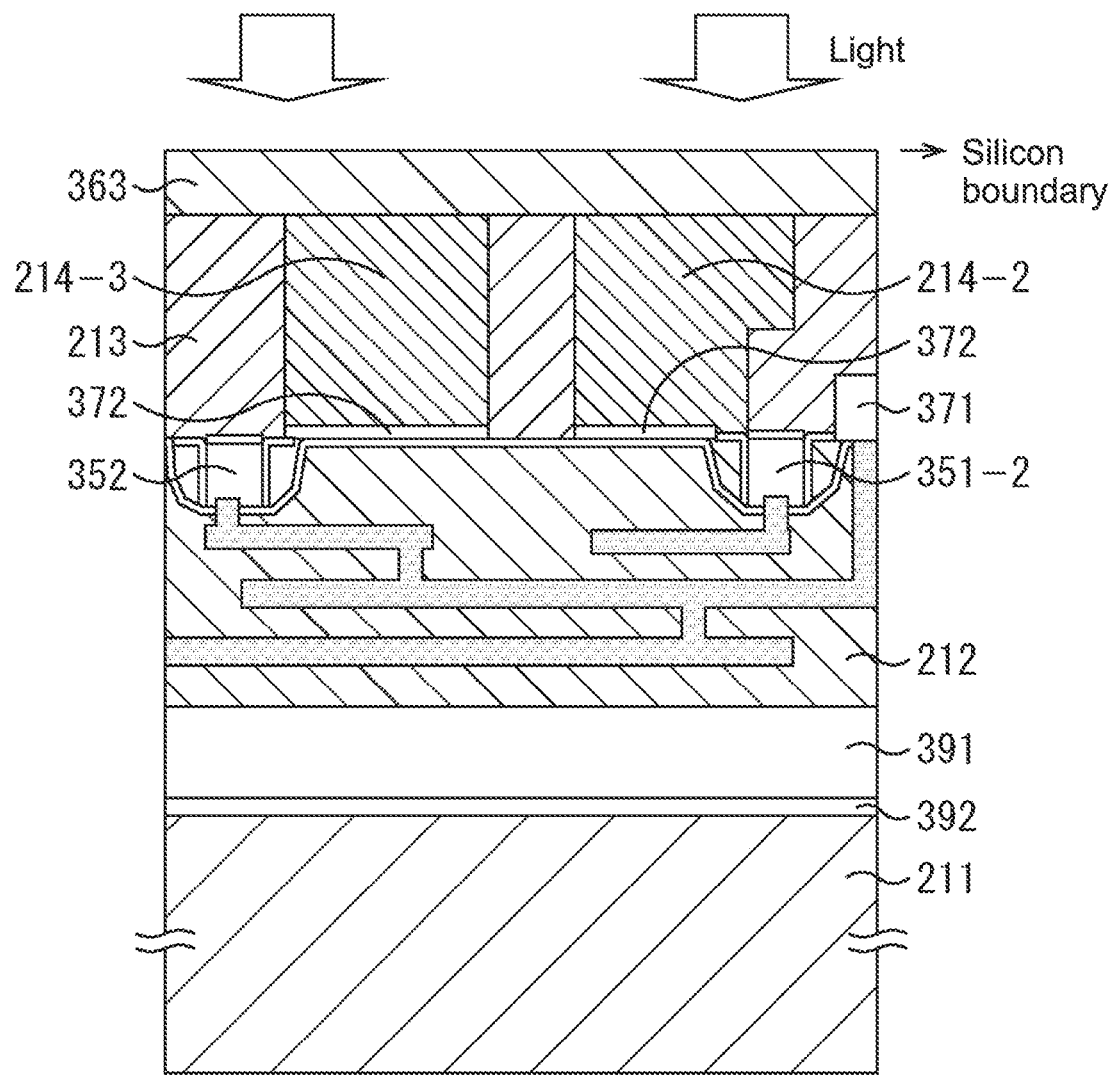
FIG. 13 is a view for illustrating a part of a pixel to be produced.

Next, by the steps S24 to S27, a part of the pixel shown in FIG. 13 is formed. Firstly, in the step S24, the support substrate 211 is adhered. Specifically, the support substrate 211 is adhered to the adhesion layer 392, as shown in FIG. 13. Adhesion is carried out by using an organic adhesive agent or applying a plasma adhesion.

In the step S25, a wafer is reversed. FIG. 13 shows an already reversed state, and the adhesion layer 392 shown at an upper side in FIG. 12 is disposed at a lower side. In the step S26, the oxide film 361 and the silicon substrate 362 are removed. In the step S27, the bottom p+ layer 363 of the SOI silicon substrate 213 is exposed.

Although the oxide film 361 and the silicon substrate 362 are disposed at a lower side of the silicon substrate 213 in a part of the pixel shown in FIG. 10B, in a part of the pixel shown in FIG. 13, the oxide film 361 and the silicon substrate 362 are already removed and are not shown. A surface where the bottom p+ layer 363 is exposed shown in an upper side of FIG. 13 will be a light irradiation surface.

Figure 8:
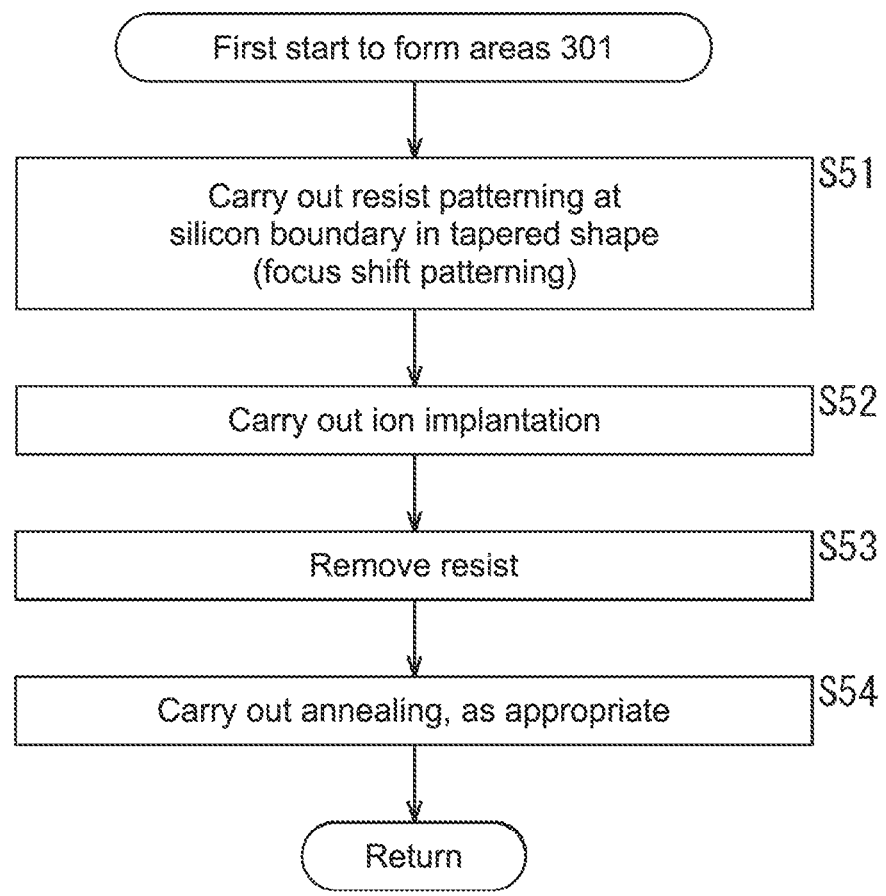
FIG. 8 is a flow chart for illustrating a first production of an area.

In the step S28, the areas 301 are formed. As to formation of the areas 301, a plurality of formation methods will be described. FIG. 8 is a flow chart for illustrating a first method for forming the areas 301.

<First Method for Forming Areas>

Figure 14:
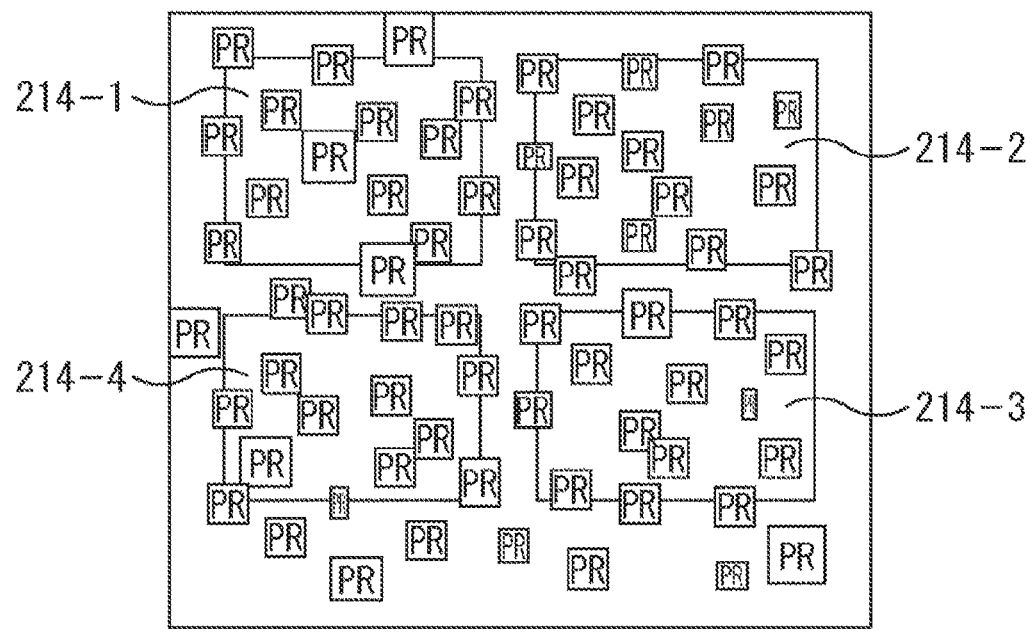
FIG. 14 is a view for illustrating a size and an arrangement of each photo resist.

In the step S51, at the boundary of the silicon substrate 213, resist patterning is carried out to form tapered shapes. FIG. 14 is a view after the registry patterning to form the tapered shapes is carried out, and shows the silicon substrate 213 viewed from the light irradiation surface. In FIG. 14, each "PR" denotes a photo resist, and each square denotes a shape, a size and a position formed of each photo resist.

Each photo resist is patterned in a square. By the properties of the photo resists, the areas 301 formed become circles. Accordingly, as described later, the areas 301 formed have conical shapes. Although the description is herein continued as the shape of each photo resist is square, each photo resist may have a shape of a triangle or a circle.

The size and the position formed of each photo resist may be regular but are desirably random. For example, when each photo resist having the same size is patterned regularly, the areas 301 formed will have the same size and be disposed regularly. In this case, the regular pattern may appear as ghosts, for example. In order to prevent this, the size and the position of each photo resist patterned are not regular but random.

Although the description is herein continued as the size and the position of each photo resist to be patterned are random, any one of which may be random. For example, the size of each photo resist may be same, but the position thereof may be random.

The photo resists to be patterned are desirably closely positioned. As described referring to FIG. 5, the areas 301 are disposed for absorbing the difference between the refractive indices and for inhibiting reflection of light at the boundary of the silicon substrate 213. If the areas 301 are disposed coarsely on the silicon substrate 213, the difference between the refractive indices cannot be absorbed, and any of the areas cannot inhibit the reflection. In order to prevent those, the areas 301 are patterned such that the areas 301 are disposed closely.

Figure 15:
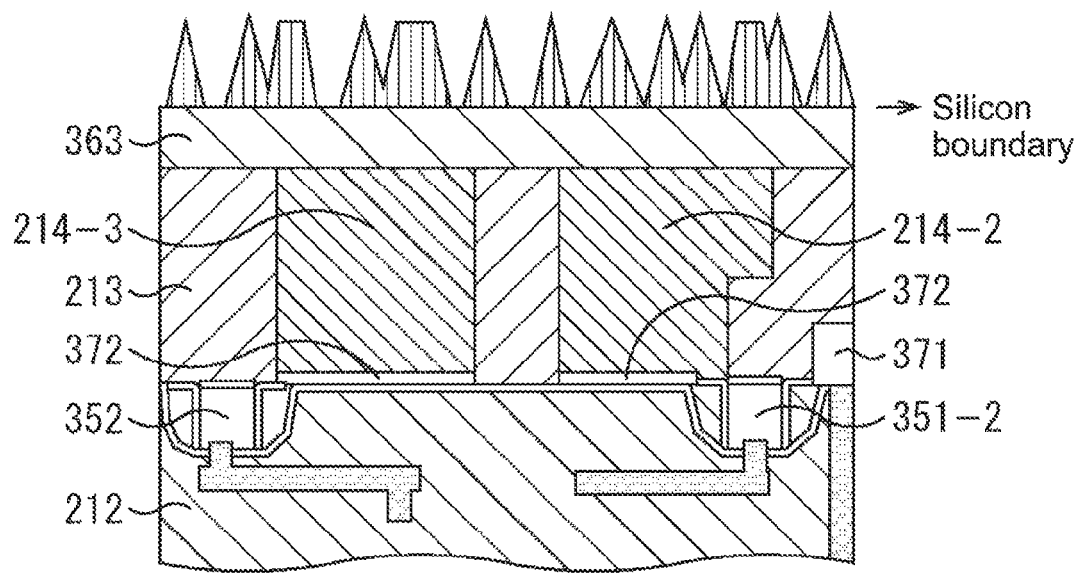
FIG. 15 is a view for illustrating a formation of a photo resist.

The photo resists are patterned by shifting the focus. The photo resists shown in FIG. 15 are formed. FIG. 15 shows the cross section of the pixel after patterned by shifting the focus.

Each photo resist has a triangle or a trapezoid shape where the bottom is the boundary of the silicon substrate 213 when viewing from the cross section. When the boundary of the silicon substrate 213 is defined as a lower side and the direction away from the boundary of the silicon substrate 213 is defined as an upper side, each photo resist is thinner as it gets to the upper side in a direction from the bottom to the upper. As described above, the shape of each photo resist gets conical.

As shown in FIG. 15, the shapes of the photo resists are basically conical, and are triangle and trapezoid when viewing from the cross section. The sizes of the photo resists are varied, and the photo resists are patterned such that the diameters of the conical shapes are different. Herein, the shape of each photo resist is tetragon when viewing from the light irradiation side of the silicon substrate 213 and the shape of each photo resist is therefore a four sided pyramid as a whole. However, the shape of the bottom surface is not limited to tetragon. For example, each photo resist may be patterned to have a triangular pyramid shape, a conical shape or the like.

In this manner, each photo resist is sterically patterned by shifting the focus. Although FIG. 15 shows all the conical shapes have the same height, it is possible to have different heights. As described later, the height can be changed to the upper limit thereof.

In the step S51 (FIG. 8), as described above, the silicon surface (the light irradiation surface) where the bottom p+ layer 363 is exposed is resist-patterned to have a tetragonal pyramid shape, a triangular pyramid shape or a conical shape. Upon the resist patterning, a conical shape is provided by shifting the focus.

Figure 16:
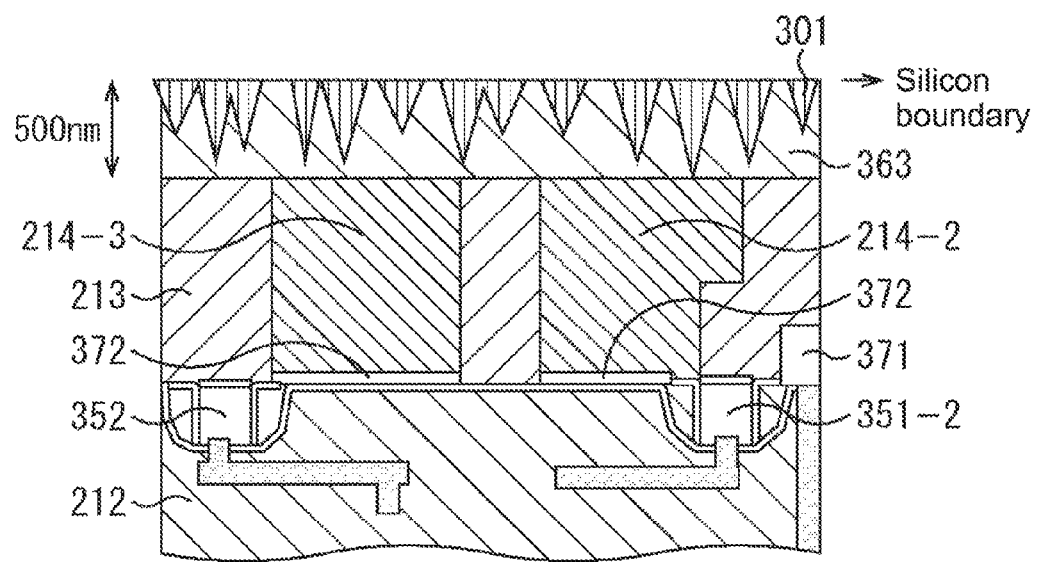
FIG. 16 is a view for illustrating a part of a pixel to be produced.

In the step S52, the ion implantation is carried out. In the step S53, the resist is removed. In the step S54, annealing is carried out, as appropriate. Through the steps S52 to S54, a part of the pixel shown in FIG. 16 is formed.

To the silicon substrate 213 where each photo resist is patterned shown in FIGS. 14 and 15, a $1E16/cm^2$ dose or more of Si is ion implanted at 300 keV. As an example, an amorphous layer is continuously produced to a depth of about 400 nm. When the temperature of the ion implantation is decreased to lower than the room temperature, crystal restoration by self-annealing is suppressed. Therefore, the amorphous layer can be formed at lower energy and dose.

The amorphous layer in silicon is tapered by patterning each photo resist such that an amorphous area is reduced in a depth direction. The amorphous silicon has a refractive index of 2.4 to 3.5 lower than the crystal silicon having a refractive index of 3.4 to 4.2. In this manner, the minute areas 301 having the different refractive index to be intended can be formed. After the ion implantation, the resist is removed by asking or by using a sulfuric acid peroxide mixture.

After the ion is implanted and the photo resists are removed, there can be provided the silicon substrate 213 where the areas 301 corresponding to the patterned photo resists are formed.

Alternatively, a $1E17/cm^2$ dose of carbon, nitrogen or oxygen is injected at 100 keV after the amorphous layer is formed. At a depth of about 300 nm, a concentration of little less than $1E22/cm^3$ of carbon, nitrogen or oxygen is injected. Then, a $5E16/cm^2$ dose or more of ions are injected at 50 keV, and a $5E16/cm^2$ dose or more of ions are injected at 30 keV such that existence probability of carbon, nitrogen or oxygen becomes higher as it approaches to the boundary of the silicon substrate 213.

After the resist is removed, a part of SiC, $Si_3N_4$ and $SiO_2$ is precipitated. As SiC has a refractive index of 2.6, $Si_3N_4$ has a refractive index of 1.3 to 2, and $SiO_2$ has a refractive index of 1.6 to 2.1, the refractive index can be partly decreased. By cluster ion implantation, the concentration of carbon, nitrogen or oxygen can be increased and crystallization by self-annealing can be promoted in the area near the surface.

In this way, when the ion is implanted and the photo resists are removed, there can be provided the silicon substrate 213 where the areas 301 corresponding to the patterned photo resists are formed.

The minute areas 301 having the different refractive index are formed in the bottom p+ layer shallower than a depth where bottom p+ layer has a hole concentration of $1E16/cm^3$ or more (for example, about 500 nm). By forming the areas 301 satisfying the conditions, electrons produced due to defects of the areas 301 are recombined with holes, whereby the electrons produced are detected by the photo diodes 214 to prevent a dark current and a white spot.

After the areas 301 are formed in this manner, the color filter layer 218 and so on are further formed, as described later. The light incident on the photo diodes 214 through the color filter layer 218 has the wavelength corresponding to the color filter layer 218. Considering the wavelength of the incident light transmitted through the color filter layer 218, the reflection at the boundary of the silicon substrate 213 can be efficiently inhibited.

For example, when the color filter layer 218 is composed of RGB (Red, Green, Blue), a patterning may be carried out to provide the photo resists having the shapes such that each area 301 suitable to each light wavelength for R, G and B.

Figure 17:
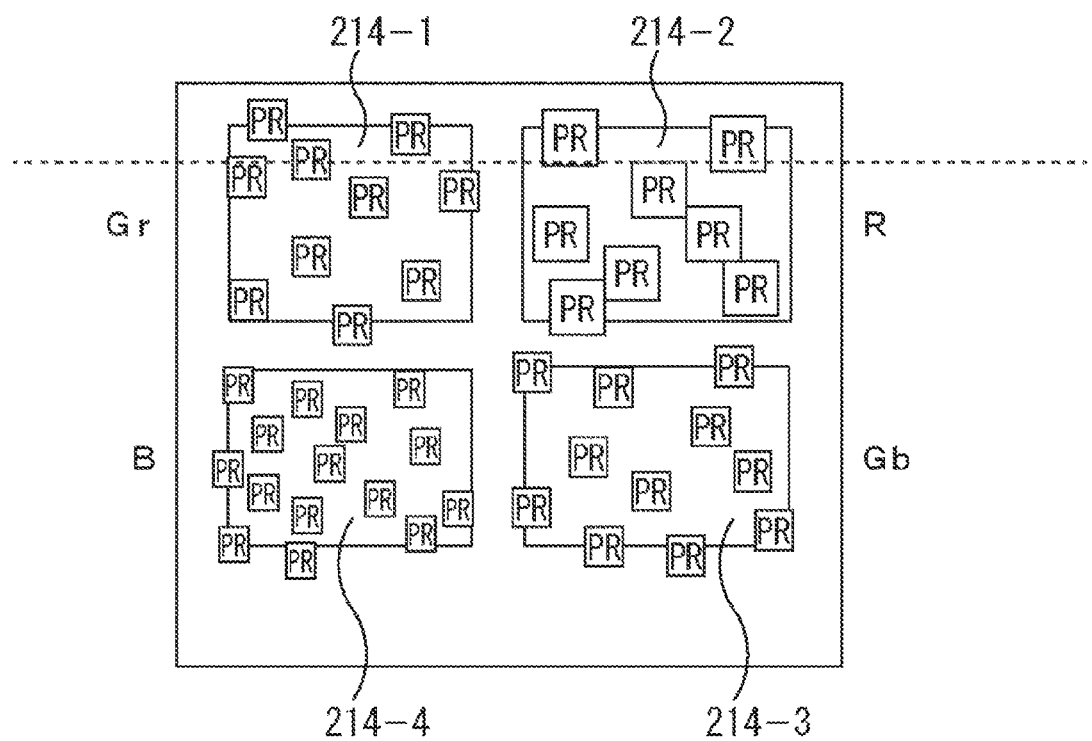
FIG. 17 is a view for illustrating a size and an arrangement of each photo resist.

As shown in FIG. 17, the color filter layer 218 is disposed and each photo diode 214 receives the light transmitted through the color filter layer 218. Specifically, in FIG. 17, the photo diode 214-1 and the photo diode 214-3 receive green (Gr, Gb) light, the photo diode 214-2 receives red (R) light, and the photo diode 214-4 receives blue (B) light.

Each photo resist can have a diameter optimized for the wavelength of the light. The diameter of each photo resist is shorter than a half of the light to be perceived. For example, when the light having the wavelength of 600 nm is perceived, each photo resist is formed to have the diameter of 300 nm or less.

When the wavelengths of the light to be perceived by the respective pixels (the photo diodes 214) are different as shown in FIG. 17 to optimize the diameter for patterning per pixel, a blue pixel has a diameter of 150 nm, a green pixel has a diameter of 250 nm, and a red pixel has a diameter of 300 nm, for example.

In this case, each photo resist has a diameter of 150 nm formed at the photo diode 214-4 receiving a blue light. Similarly, each photo resist has a diameter of 250 nm formed at the photo diode 214-1 and the photo diode 214-3 receiving a green light. Further, each photo resist has a diameter of 300 nm formed at the photo diode 214-2 receiving a red light.

Accordingly, as shown in FIG. 17, the photo resists formed on the respective photo diodes 214 have different diameters (sizes).

Figure 18:
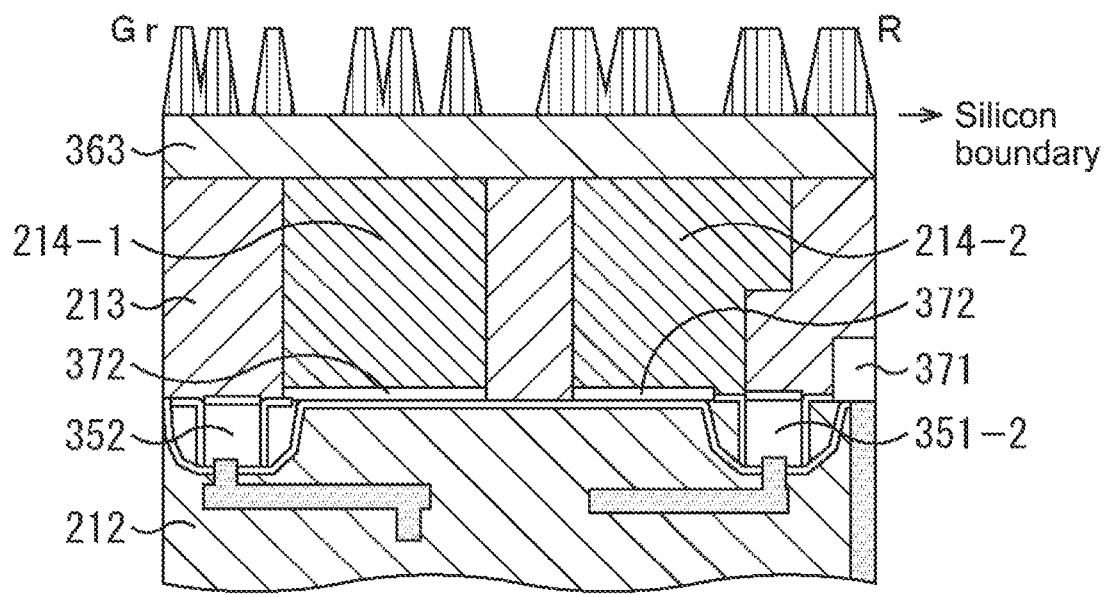
FIG. 18 is a view for illustrating a formation of a photo resist.

FIG. 18 shows a cross section cut along the line shown in FIG. 17. In FIG. 18, the photo diode 214-1 receiving the green (Gr) light is disposed at a left side, and the photo diode 214-2 receiving the red (R) light is disposed at a right side.

As described above, each photo resist has a triangle or a trapezoid shape where the bottom is the boundary of the silicon substrate 213 when viewing from the cross section. The photo resists are formed such that bottom lengths of the triangle or the trapezoid shapes in the photo diodes 214-1 and 214-2 are different. As shown in FIG. 18, each diameter (250 nm) of the photo resists on the photo diode 214-1 receiving a green light is smaller than each diameter (300 nm) of the photo resists on the photo diode 214-2 receiving a red light.

Thus, the areas 301 corresponding to the wavelengths of the light received are formed generally in accordance with the steps of the flow chart shown in FIG. 8. The flow chart shown in FIG. 8 is already described, and thus detailed description thereof will be herein omitted.

Figure 19:
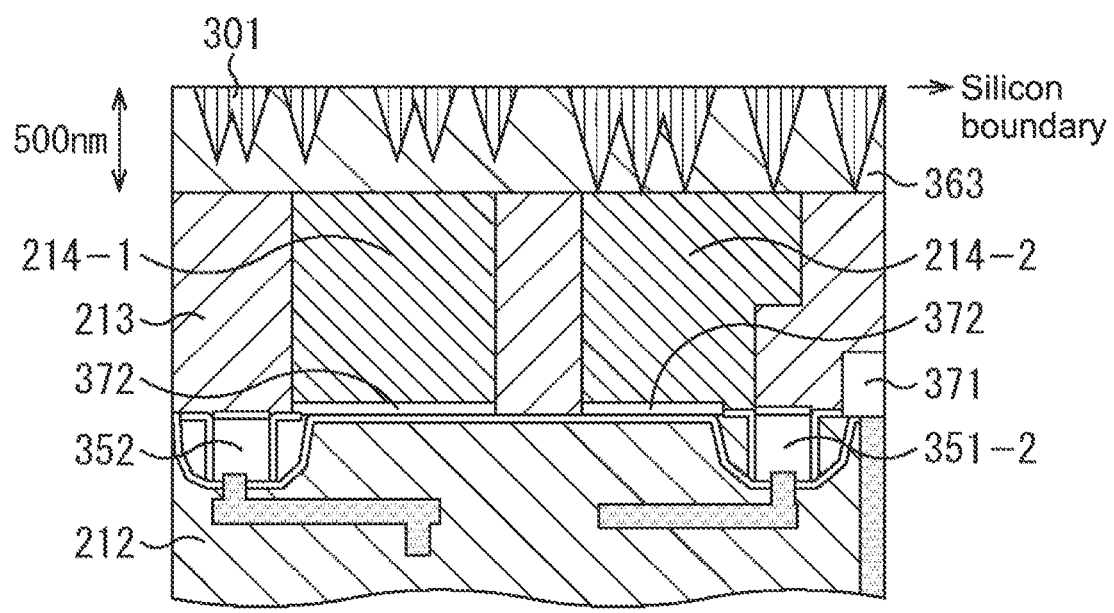
FIG. 19 is a view for illustrating a part of a pixel to be produced.

By carrying out the steps shown in FIG. 8, the areas 301 shown in FIG. 19 are formed. Referring to FIGS. 18 and 19, as the photo resists formed on the photo diode 214-1 receiving a green light are smaller than the photo resists formed on the photo diode 214-2 receiving a red light as shown in FIG. 18, the areas 301 formed on the photo diode 214-1 are smaller than the areas 301 formed on the photo diode 214-2.

<Second Method for Forming Areas>

Figure 9:
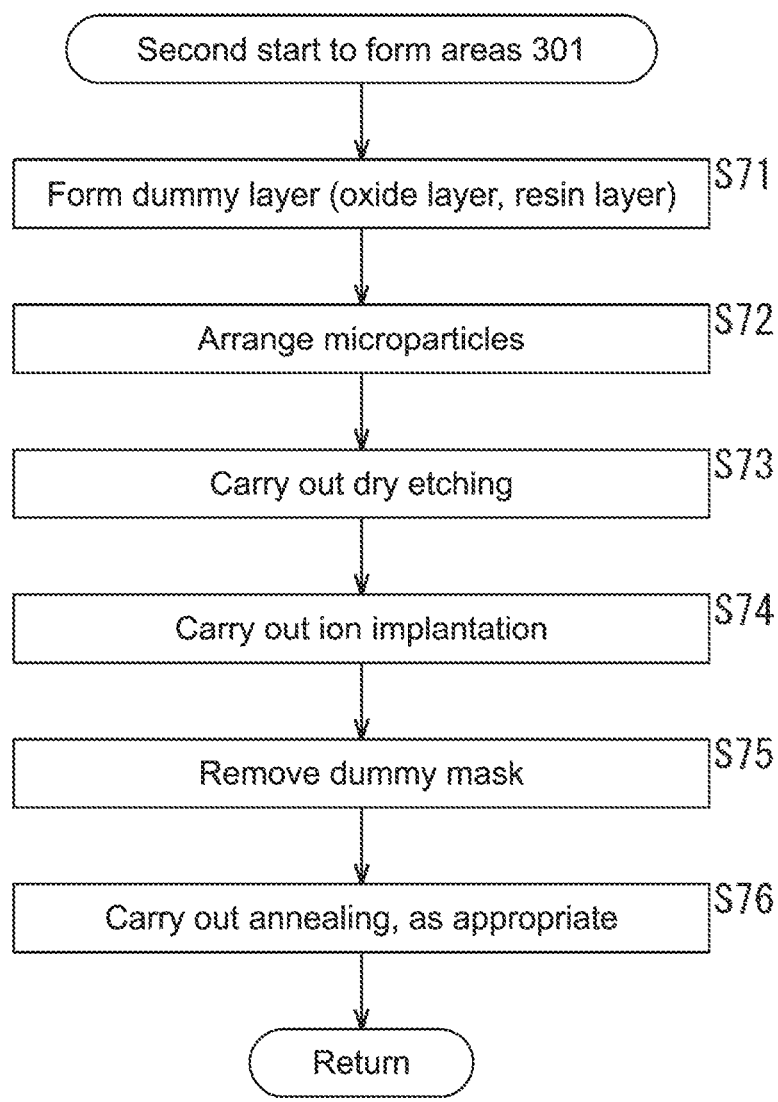
FIG. 9 is a flow chart for illustrating a second production of an area.

Next, referring to a flow chart of FIG. 9, a second method for forming the areas 301 will be described. In the step S71, a dummy layer is formed. In the step S72, microparticles are arranged. In the step S73, a dry etching is carried out.

In other words, in the second method of forming the areas 301, the dummy layer such as an oxide film and a resin layer is formed, the microparticles are arranged, and the etching is carried out, thereby forming a tapered dummy layer mask, dissimilar to the resist patterning in the first method of forming the areas 301. The description of Japanese Laid-Open Patent Application No. 2010-239003 by the applicant can be applied to the formation.

Figure 20:
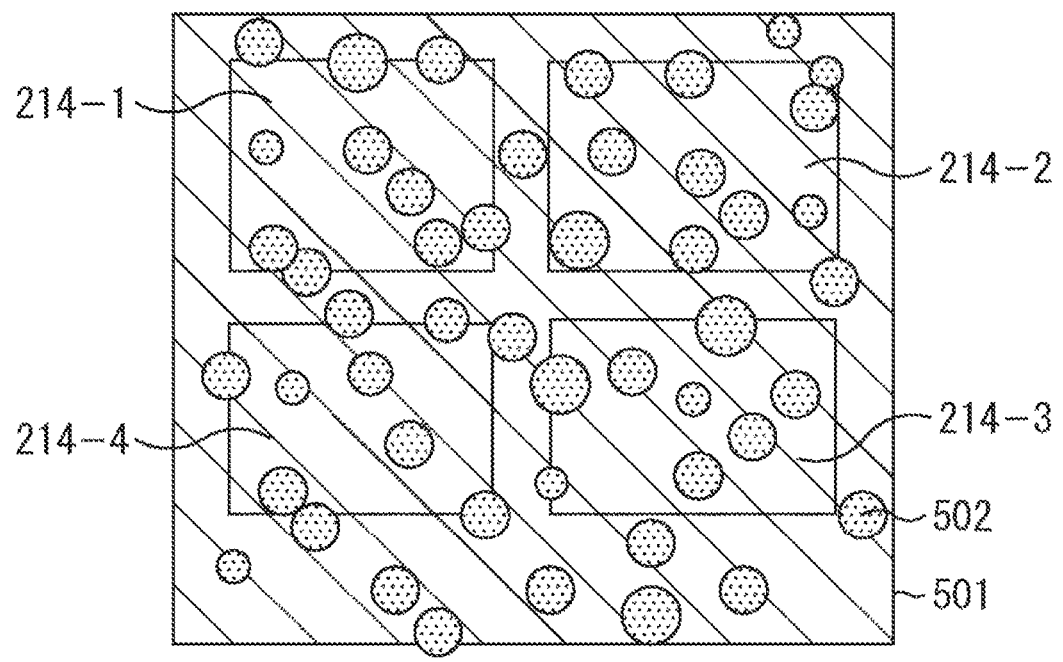
FIG. 20 is a view for illustrating an arrangement of a dummy layer and microparticles.
Figure 21:
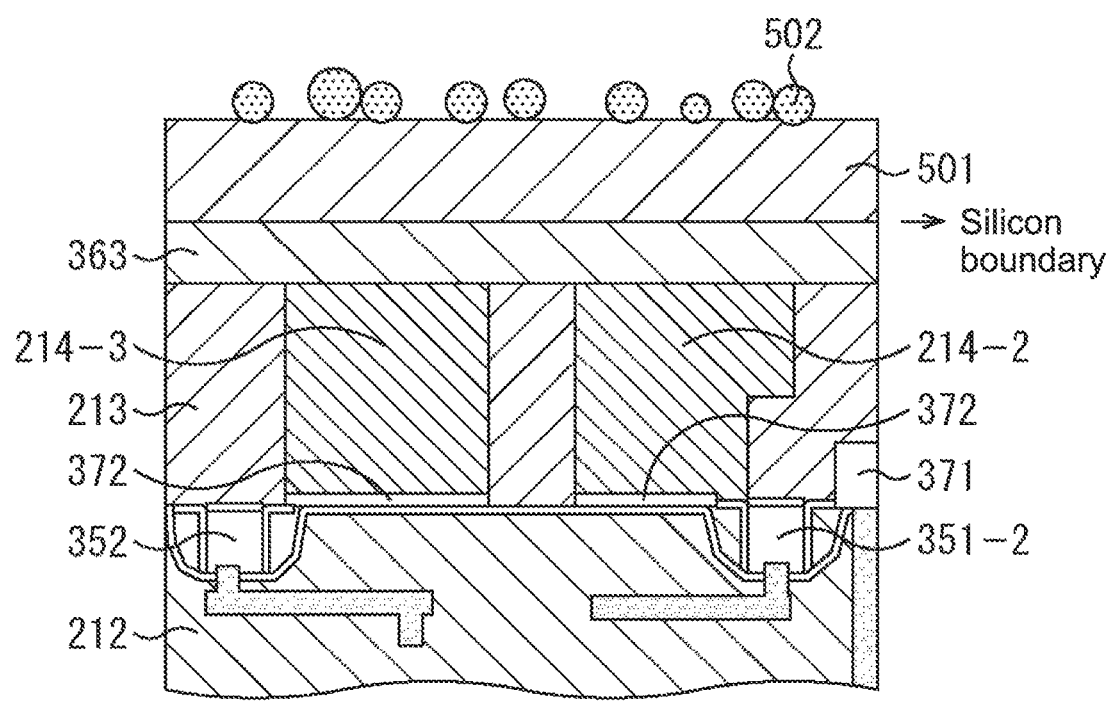
FIG. 21 is a view for illustrating an arrangement of a dummy layer and microparticles.

FIG. 20 is a view of pixels on which microparticles are arranged viewed from the light irradiation side, and FIG. 21 is a sectional view thereof. As shown in FIG. 21, a dummy film 51 is formed on the silicon substrate 213, and microparticles 502 are arranged thereon.

As shown in FIG. 20, a size of each microparticle 502 may be random or uniform as prescribed. Alternatively, the size may be tailored based on the color of the pixel. Also, the microparticles 502 may be arranged randomly as shown in FIG. 20 or regularly. However, as the regular pattern may appear as ghosts, the size and the arrangement are desirably random, similar to the first production method.

Figure 22:
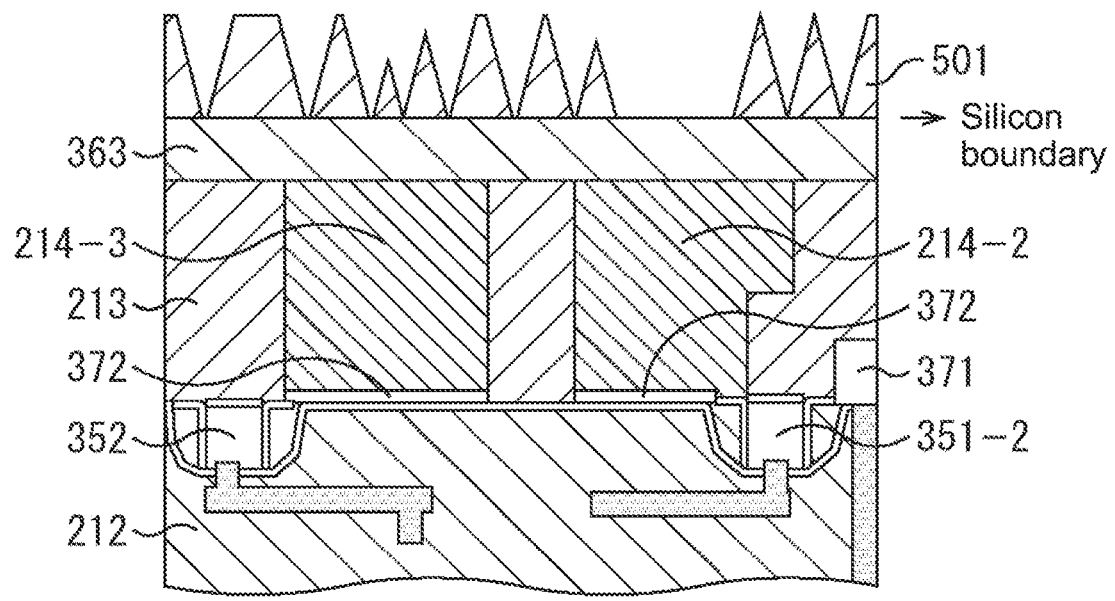
FIG. 22 is a view for illustrating a formation of a mask.
Figure 23:
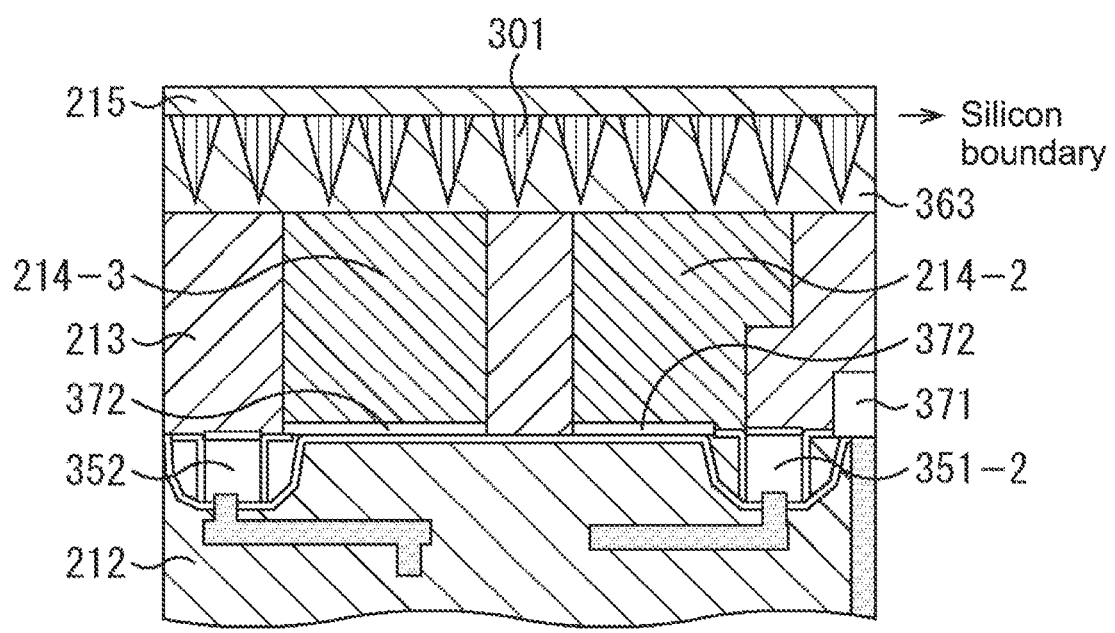
FIG. 23 is a view for illustrating a part of a pixel to be produced.
Figure 24:
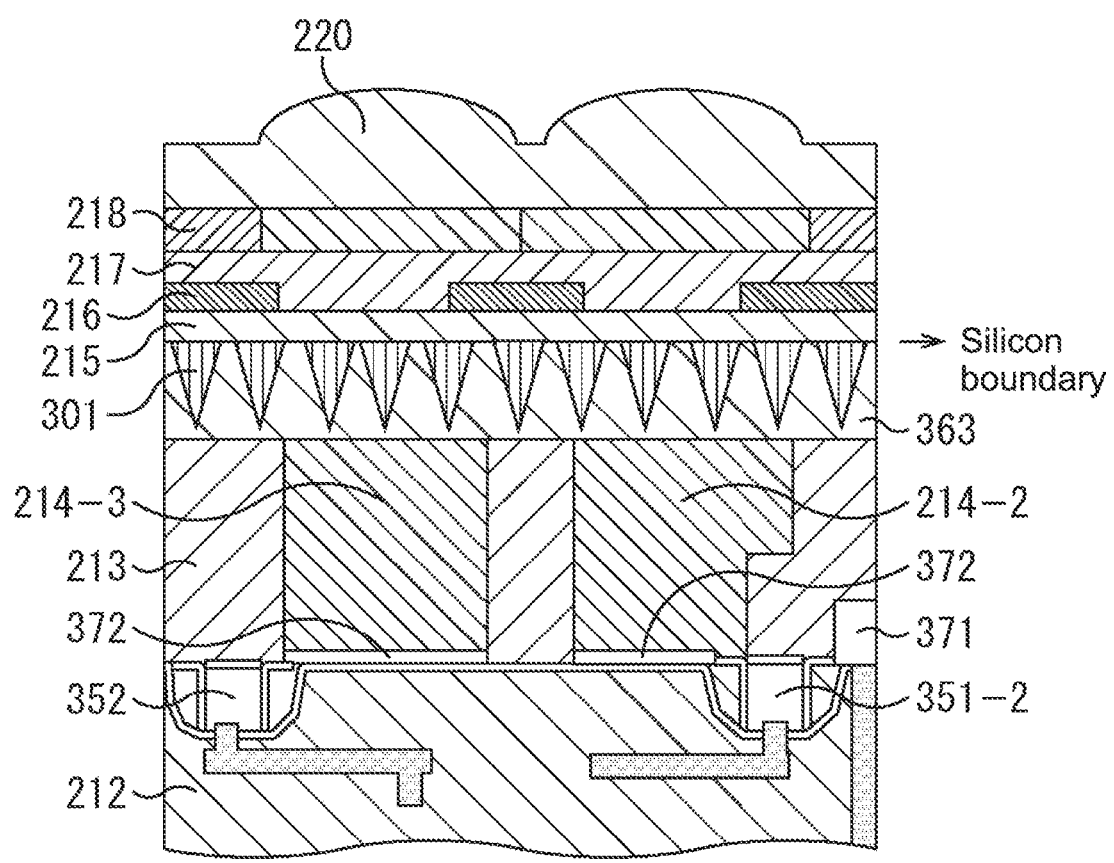
FIG. 24 is a view for illustrating a part of a pixel to be produced.

After the dummy layer 501 is formed and the microparticles 502 are arranged, a dry etching is carried out to form the mask of the dummy layer 501 as shown in FIG. 22. When portions where no microparticles 502 are arranged are dry etched, the portions remain as the mask.

Statuses of the pixels shown in FIG. 22 correspond to the statuses of the pixels shown in FIG. 15. The subsequent steps may be carried out similar to those for the pixels shown in FIG. 15. Specifically, the steps S74 to S76 shown in FIG. 9 can be carried out similar to the steps S52 to S54 shown in FIG. 8.

In the step S74, the ion implantation is carried out to form the areas 301. In the step S75, the dummy mask (the dummy layer 501) is removed. In the step S76, annealing is carried out, as appropriate.

In this manner, the mask may be formed using the dummy layer 501 and the microparticles 502, and the areas 301 may be formed by the ion implantation.

Figure 7:
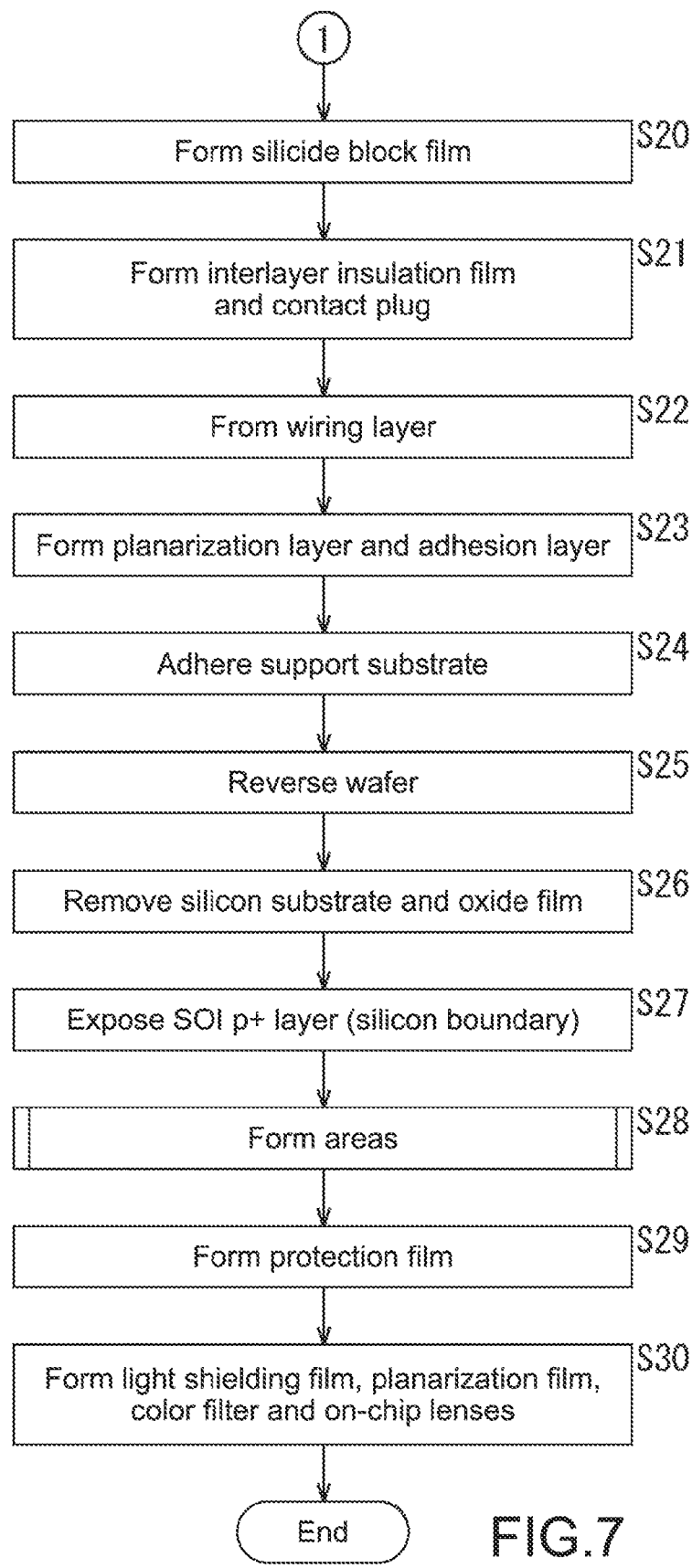
FIG. 7 is a flow chart for illustrating a production of a semiconductor package.

By the first or second production method, the areas 301 having the different refractive index from the silicon substrate 213 can be formed in the silicon substrate 213. Once the areas 301 are formed in this way, it proceeds to the step S29 (FIG. 7).

In the step S29, the protection film 215 is formed on the silicon substrate 213 at a side where the areas 301 are formed. For example, the protection film 215 is formed of P-TEOS at a thickness of 100 nm. The surface of the silicon substrate 213 on which the protection film 215 is formed has no concave-convex portion, thereby forming an even film.

In the step S30, the light shielding films 216, the planarization film 217 and the microlenses 220 are formed, thereby producing a back illumination type solid state image sensor. These films may be partly reduced in order to decrease the height and the steps.

By forming the areas 301 having the refractive index different from those of the silicon substrate 213 and the protection film 215 formed on the silicon substrate 213 on the silicon substrate 213, the reflection of the light generated by the difference in the refractive indices can be inhibited.

By inhibiting the reflection of the light, a light amount incident on the photo diodes 214 can be increased to improve a sensitivity. Also, by inhibiting the reflection, ghosts caused by the reflected light can be prevented. In addition, as the silicon substrate 213 has no concaveconvex portion, the films can be formed evenly on the silicon substrate 213. In this way, the yield can be increased by suppressing a sensitivity unevenness.

The present embodiments according to the present technology are not limited to the above-described embodiments, and variations and modifications may be made without departing from the scope of the present technology.

The present technology may have the following configurations.

(1) An image sensor, including:
a photoelectric conversion unit for converting a received light into an electric charge;
a semiconductor substrate including the photoelectric conversion unit; and
a plurality of areas each having a refractive index different from a refractive index of the semiconductor substrate formed between a surface of the semiconductor substrate on which light is incident and the photoelectric conversion unit.

(2) The image sensor according to (1) above, in which
each of the areas is formed to have a wide area at a depth near a light incident surface of the silicon substrate, and have a narrow area at a depth farther from the light incident surface.

(3) The image sensor according to (1) or (2) above, in which
each of the areas has a conical shape.

(4) The image sensor according to any one of (1) to (3) above, in which
a relationship n1<n3<n2 is satisfied where a film on the semiconductor substrate has a refractive index n1, the semiconductor substrate has a refractive index n2, and each of the areas has a refractive index n3.

(5) The image sensor according to any one of (1) to (4) above, in which
the semiconductor substrate is formed of silicon.

(6) The image sensor according to any one of (1) to (5) above, in which
the areas comprise either one of amorphous silicon, SiC, $Si_3N_3$ and $SiO_2$.

(7) The image sensor according to any one of (1) to (6) above, in which
either one of an oxide film and a nitride film is formed on the semiconductor substrate.

(8) The image sensor according to any one of (1) to (7) above, in which each of the areas has a diameter of 100 nm to 300 nm and has a deepest position of 400 nm or less having a hole concentration of $1E16/cm^3$ or more.

(9) The image sensor according to any one of (1) to (8) above, in which
the areas are formed in different sizes depending on a wavelength of light received at the photoelectric conversion unit.

(10) The image sensor according to any one of (1) to (9) above, in which
the areas are formed by ion implantation using either one of a tapered resist mask and a hard mask, and by laser annealing.

(11) An apparatus of producing an image sensor including a photoelectric conversion unit for converting a received light into an electric charge and a semiconductor substrate including the photoelectric conversion unit, including:
a unit for forming a plurality of areas each having a refractive index different from that of the semiconductor substrate formed between a surface of the semiconductor substrate on which light is incident and the photoelectric conversion unit.

(12) The production apparatus according to (11) above, in which
the areas are formed by ion implantation using either one of a tapered resist mask and a hard mask, and by laser annealing.

(13) A method of producing an image sensor including a photoelectric conversion unit for converting a received light into an electric charge and a semiconductor substrate including the photoelectric conversion unit, including:
forming a plurality of areas each having a refractive index different from that of the semiconductor substrate between a surface of the semiconductor substrate on which light is incident and the photoelectric conversion unit.

(14) An electronic device, including:
a photoelectric conversion unit for converting a received light into an electric charge;
a semiconductor substrate including the photoelectric conversion unit, and including a plurality of areas each having a refractive index different from that of the semiconductor substrate formed between a surface of the semiconductor substrate on which light is incident and the photoelectric conversion unit;
an optical component for leading an incident light to the photoelectric conversion unit; and
a signal processing unit for processing an output signal from the photoelectric conversion unit.

It should be understood by those skilled in the art that various modifications, combinations, sub-combinations and alterations may occur depending on design requirements and other factors insofar as they are within the scope of the appended claims or the equivalents thereof.

What is claimed is:

1. An image sensor, comprising:
a photoelectric conversion unit for converting received light into an electric charge;
a semiconductor substrate including the photoelectric conversion unit; and
a plurality of areas each having a refractive index different from a refractive index of the semiconductor substrate formed between a light incident surface of the semiconductor substrate and the photoelectric conversion unit, wherein each of the areas has a wide area at a depth near the light incident surface of the semiconductor substrate, and has a narrow area at a depth near the photoelectric conversion unit.

2. The image sensor according to claim 1, wherein
each of the areas has a conical shape, wherein a base of the conical shape is adjacent the light incident surface of the semiconductor substrate, and wherein a tip of the conical shape is adjacent the photoelectric conversion unit.

3. The image sensor according to claim 1, wherein a relationship n1<n3<n2 is satisfied where a film on the semiconductor substrate has a refractive index n1, the semiconductor substrate has a refractive index n2, and each of the areas has a refractive index n3.

4. The image sensor according to claim 1, wherein the semiconductor substrate is formed of silicon.

5. The image sensor according to claim 1, wherein the areas comprise either one of amorphous silicon, SiC, $Si_3N_3$ and $SiO_2$.

6. The image sensor according to claim 1, wherein either one of an oxide film and a nitride film is formed on the semiconductor substrate.

7. The image sensor according to claim 1, wherein each of the areas has a diameter of 100 nm to 300 nm and has a deepest position of 400 nm or less having a hole concentration of $1E16/cm^3$ or more.

8. The image sensor according to claim 1, wherein the areas are formed in different sizes depending on a wavelength of light received at the photoelectric conversion unit.

9. The image sensor according to claim 1, wherein the areas are formed by ion implantation using either one of a tapered resist mask and a hard mask, and by laser annealing.

10. An apparatus for producing an image sensor including a photoelectric conversion unit for converting received light into an electric charge and a semiconductor substrate including the photoelectric conversion unit, comprising:
a unit for forming a plurality of areas each having a refractive index different from that of the semiconductor substrate formed between a surface of the semiconductor substrate on which light is incident and the photoelectric conversion unit, wherein each of the areas has a wide area at a depth near the light incident surface of the semiconductor substrate, and has a narrow area at a depth near the photoelectric conversion unit.

11. The production apparatus according to claim 10, wherein
the areas are formed by ion implantation using either one of a tapered resist mask and a hard mask, and by laser annealing.

12. A method of producing an image sensor including a photoelectric conversion unit for converting received light into an electric charge and a semiconductor substrate including the photoelectric conversion unit, comprising:
forming a plurality of areas each having a refractive index different from that of the semiconductor substrate between a surface of the semiconductor substrate on which light is incident and the photoelectric conversion unit, wherein each of the areas is formed to have a wide area on a incident side, and to have a narrow area on a side adjacent the photoelectric conversion unit.

13. An electronic device, comprising:
a photoelectric conversion unit for converting received light into an electric charge;
a semiconductor substrate including the photoelectric conversion unit, and including a plurality of areas each having a refractive index different from that of the semiconductor substrate formed between a surface of the semiconductor substrate on which light is incident and the photoelectric conversion unit, wherein each of the areas has a wide area at a depth near the light incident surface of the semiconductor substrate, and has a narrow area at a depth near the photoelectric conversion unit;
an optical component for leading incident light to the photoelectric conversion unit; and
a signal processing unit for processing an output signal from the photoelectric conversion unit.

* * * * *